United States Patent
Wright et al.

(10) Patent No.: US 12,087,959 B1
(45) Date of Patent: *Sep. 10, 2024

(54) SWAPPABLE BATTERY MODULES COMPRISING IMMERSION-THERMALLY CONTROLLED PRISMATIC BATTERY CELLS AND METHODS OF FABRICATING THEREOF

(71) Applicant: DIMAAG-AI, Inc., Fremont, CA (US)

(72) Inventors: Ian Wright, Woodside, CA (US); Brian Graf, Fremont, CA (US); David Kieke, Carmine, TX (US)

(73) Assignee: DIMAAG-AI, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/402,347

(22) Filed: Jan. 2, 2024

Related U.S. Application Data

(60) Provisional application No. 63/489,488, filed on Mar. 10, 2023.

(51) Int. Cl.
*H01M 50/244* (2021.01)
*B60L 53/80* (2019.01)
(Continued)

(52) U.S. Cl.
CPC ........... *H01M 50/244* (2021.01); *B60L 53/80* (2019.02); *H01M 10/613* (2015.04);
(Continued)

(58) Field of Classification Search
None
See application file for complete search history.

(56) References Cited

U.S. PATENT DOCUMENTS 6,111,387 A 8/2000 Kouzu et al.
11,784,369 B1 * 10/2023 Wright ............... H01M 50/209
429/50

(Continued)

FOREIGN PATENT DOCUMENTS

CN 216058294 U 3/2022

OTHER PUBLICATIONS

"Dry Break Quick Disconnects", DCX The Liquid Cooling Company; Retrieved from the Internet on Mar. 9, 2023: https://dcx.eu/quick-disconnects/.

(Continued)

*Primary Examiner* — Lisa S Park
(74) *Attorney, Agent, or Firm* — Polygon IP, LLP

(57) ABSTRACT

Described herein are swappable battery modules comprising immersion-thermally controlled prismatic battery cells and methods of operating thereof. A method comprises positioning a swappable battery module on an external charger comprising charger fluidic ports and sliding the swappable battery module to the charger fluidic ports until these charger's ports are fluidically coupled with the module's fluidic ports. Specifically, the external charger comprises an enclosure and a module support rail slidably coupling the swappable battery module and the enclosure. The module support rail comprises a rail base, a first slider, a second slider, and a lever-based unit, interconnecting the rail base and both sliders. The rail base is fixed to the enclosure, while the second slider is detachably coupled to the module. The two sliders move at different speeds or at the same speed relative to the charger base depending on proximity of the first end plate to the charger base.

20 Claims, 19 Drawing Sheets

(51) Int. Cl.
*H01M 10/613* (2014.01)
*H01M 10/647* (2014.01)
*H01M 10/6568* (2014.01)
*H01M 50/209* (2021.01)
*H01M 50/507* (2021.01)
*H05K 7/20* (2006.01)

(52) U.S. Cl.
CPC ..... *H01M 10/647* (2015.04); *H01M 10/6568* (2015.04); *H01M 50/209* (2021.01); *H01M 50/507* (2021.01); *H05K 7/20236* (2013.01)

(56) References Cited

U.S. PATENT DOCUMENTS

| | | | |
|---|---|---|---|
| 2010/0104927 A1* | 4/2010 | Albright | B60L 50/64 |
| | | | 429/50 |
| 2014/0111161 A1 | 4/2014 | Kim | |
| 2014/0141298 A1* | 5/2014 | Michelitsch | H01M 10/6553 |
| | | | 429/71 |
| 2015/0122562 A1 | 5/2015 | Miyashiro | |
| 2015/0357684 A1* | 12/2015 | Willgert | H01M 50/213 |
| | | | 320/112 |
| 2016/0268564 A1 | 9/2016 | Cho et al. | |
| 2016/0272043 A1 | 9/2016 | Cheng | |
| 2017/0077566 A1* | 3/2017 | Mascianica | H01M 10/6556 |
| 2017/0232865 A1 | 8/2017 | Christen et al. | |
| 2019/0379093 A1 | 12/2019 | Choi et al. | |
| 2020/0185793 A1* | 6/2020 | Itaya | G01R 31/364 |
| 2020/0287181 A1 | 9/2020 | You et al. | |
| 2023/0238814 A1* | 7/2023 | Lu | H05K 7/20409 |
| | | | 320/107 |

OTHER PUBLICATIONS

"Series HC: Clean-break couplings for high-pressure hydraulic applications", Walther-Prazision; Retrieved from the Internet on Mar. 9, 2032: https://www.walther-praezision.de/en/products/mono_couplings/clean_break_up_to_650_bar_10000_psi/series_hc/index.html.

U.S. Appl. No. 18/182,912, Non Final Office Action mailed May 19, 2023, 23 pgs.

U.S. Appl. No. 18/182,912, Notice of Allowance mailed Jun. 22, 2023, 7 pgs.

Wilhelm, Grant, "6 traits of non-spill connectors", Connector Tips Editor, Feb. 3, 2015; Retrieved from the Internet: https://www.connectortips.com/6-traits-non-spill-connectors/.

* cited by examiner

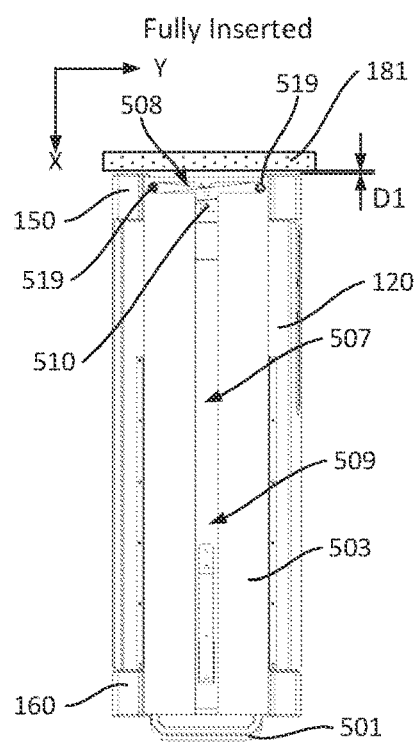
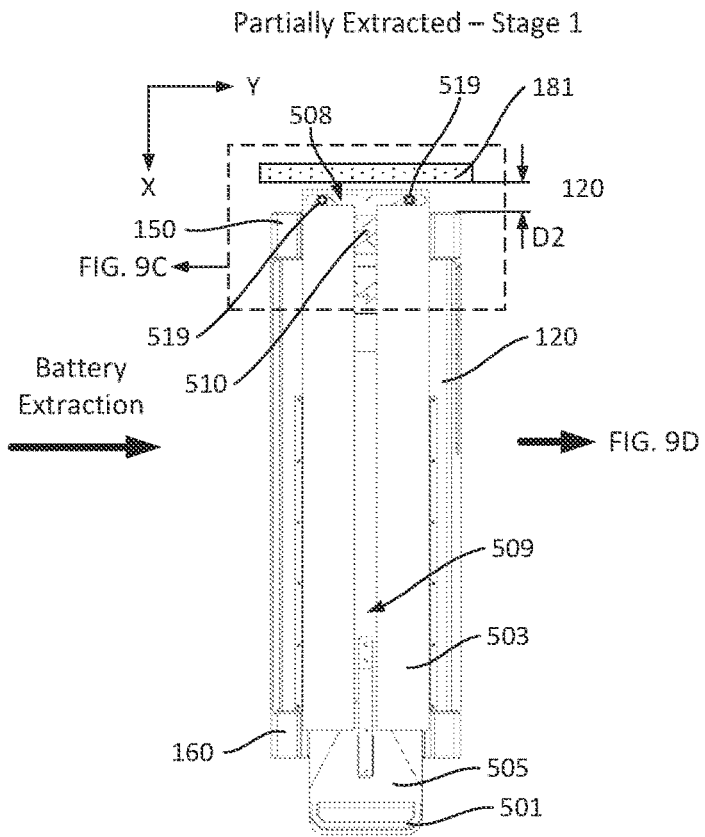
FIG. 9A
FIG. 9B
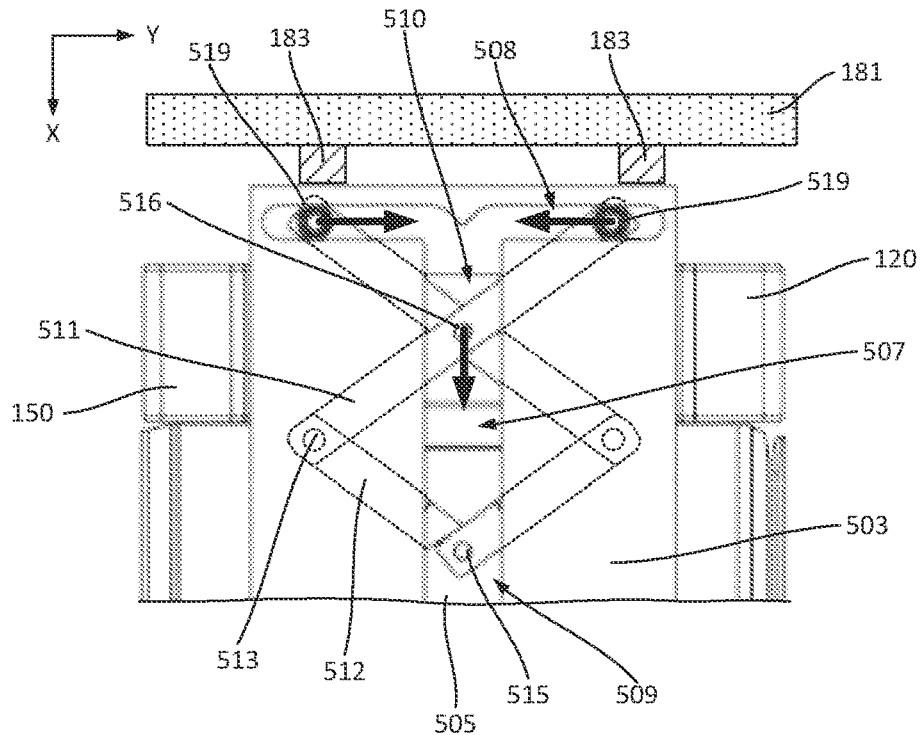
FIG. 9C

SWAPPABLE BATTERY MODULES COMPRISING IMMERSION-THERMALLY CONTROLLED PRISMATIC BATTERY CELLS AND METHODS OF FABRICATING THEREOF

CROSS-REFERENCE TO RELATED APPLICATIONS

This application claims the benefit under 35 U.S.C. § 119(e) of U.S. Provisional Patent Application No. 63/489,488, filed on 2023 Mar. 10, both of which are incorporated herein by reference in their entirety for all purposes.

BACKGROUND

Electric vehicles are propelled using electric motors powered by battery packs. Each battery pack can include one or more swappable battery modules, each comprising one or more battery cells. These cells can be connected in series and/or parallel and controlled by a battery management system. While the operating temperature of battery cells depends on various materials used to fabricate these cells (e.g., electrolyte solvents), most battery cells are designed to operate in the 0-60° ° C. range. It should be noted that battery cells can be very sensitive to their operating temperatures. For example, the power rating of battery cells can drop quickly with the temperature (caused by lower ionic mobility). At the same time, battery cells degrade faster and can potentially enter unsafe conditions when operated at high temperatures.

In addition to various environmental conditions that can change cells' operating temperature, battery cells can generate considerable heat while charging and discharging, especially at high rates (that can be desirable for many applications). For example, Joule heating caused by cells' internal resistance is one of the largest contributors. Other contributors include but are not limited to electrode reactions and entropic heat generation caused by the insertion and de-insertion of lithium ions in and out of the electrodes. To maintain optimum operating temperatures, the heat must be removed from the battery cells as this heat is being generated within the cells. It should be noted that other components of battery packs (e.g., bus bars that interconnect battery cells) can also cause heating and should be cooled whenever possible.

Liquid cooling or, more generally, liquid-based thermal management of battery cells is beneficial in comparison to, e.g., air cooling because of the large heat capacities and heat transfer coefficient of many liquids in comparison to air. However, controlling the distribution of liquid within battery packs can be challenging. For example, most liquid-cooled battery packs have battery cells isolated from liquid passages thereby preventing any direct contact between the cells and thermal fluid and relying on various heat-transferring components positioned in between. Furthermore, many liquid-cooled battery packs utilize cylindrical cells (e.g., 18650 cells) because of their small factor and ease of cooling (e.g., by thermal coupling to cell bottoms). However, battery packs with cylindrical cells tend to have lower energy density because of their inherent packing density limitations. Additionally, most battery cooling systems focus on cooling batteries and ignore bus bar cooling. At the same time, the bus bar cooling can prevent the overheating of bus bars and even allow the use of bus bars with smaller cross-sections (for a given current). Finally, liquid-cooled swappable battery modules are generally stationary (e.g., permanently positioned on electric vehicles). At the same time, many applications (e.g., smaller electric vehicles) can benefit from swappable batteries that, for example, can be charged remotely and that can also be liquid-cooled (e.g., while on the vehicle and/or on the external charger). However, forming/severing the liquid connections to a module in a fast and efficient manner can be challenging.

What is needed are new swappable battery modules comprising immersion-thermally controlled prismatic battery cells and methods of fabricating thereof.

SUMMARY

Described herein are swappable battery modules comprising immersion-thermally controlled prismatic battery cells and methods of operating thereof. A method comprises positioning a swappable battery module on an external charger comprising charger fluidic ports and sliding the swappable battery module to the charger fluidic ports until these charger's ports are fluidically coupled with the module's fluidic ports. Specifically, the external charger comprises an enclosure and a module support rail slidably coupling the swappable battery module and the enclosure. The module support rail comprises a rail base, a first slider, a second slider, and a lever-based unit, interconnecting the rail base and both sliders. The rail base is fixed to the enclosure, while the second slider is detachably coupled to the module. The two sliders move at different speeds or at the same speed relative to the charger base depending on proximity of the first end plate to the charger base.

Clause 1. A method of operating a swappable battery module, the method comprising: positioning the swappable battery module on an external charger comprising charger fluidic ports positioned on a charger base, wherein: the swappable battery module comprises prismatic battery cells, a tubular enclosure, attached to and enclosing the prismatic battery cells, a first end plate attached to the tubular enclosure, and a second end plate attached to the tubular enclosure, the tubular enclosure forms a first fluid channel, a second fluid channel, a third fluid channel, and a fourth fluid channel with the prismatic battery cells, the first end plate comprises a first fluidic port, fluidically coupled to both the first fluid channel and the third fluid channel, and a second fluidic port, fluidically coupled to both the second fluid channel and the fourth fluid channel, and the second end plate fluidically interconnects the first fluid channel and the third fluid channel and, separately, fluidically interconnects the second fluid channel and the fourth fluid channel; and sliding the swappable battery module such that the first end plate is directed toward the charger base and the charger fluidic ports until the charger fluidic ports are fluidically coupled with the first fluidic port and the second fluidic port.

Clause 2. The method of clause 1, wherein: the external charger comprises an enclosure and a module support rail slidably coupling the swappable battery module and the enclosure, the module support rail comprises a rail base, a first slider, a second slider, and a lever-based unit, interconnecting the rail base, the first slider, and the second slider, the rail base is fixed to the enclosure, the second slider is detachably coupled to the swappable battery module, and the first slider and the second slider move at different speeds or at a same speed relative to the charger base depending on proximity of the first end plate to the charger base.

Clause 3. The method of clause 2, wherein: the rail base comprises a rail-base slot defined by an engagement slot section and an extraction slot section, extending perpendicular to the engagement slot section, the lever-based unit comprises bushings slidably fit into the rail-base slot, when the bushings is in the engagement slot section, the first slider moves faster than the second slider, and when the bushings is in the extraction slot section, the first slider and the second slider move at the same speed.

Clause 4. The method of clause 3, wherein, when the bushings are in the engagement slot section, the first slider moves at least twice faster than the second slider.

Clause 5. The method of clause 3, wherein, when the bushings are in the engagement slot section, the first slider moves at least three times faster than the second slider.

Clause 6. The method of clause 3, wherein: the lever-based unit comprises a first lever set and a second lever set, and the first lever set is connected to the bushings at a first end, pivotably connected to the first slider at a midpoint, and pivotably connected to the second lever set at a second end of the first lever set, opposite to the first end, and the second lever set is pivotably connected to the first lever set and the first slider at opposite ends of the second lever set.

Clause 7. The method of clause 6, wherein: when the bushings slide within in the engagement slot section, an angle between the first lever set and the second lever set changes, and when the bushings slide within the extraction slot section, the angle between the first lever set and the second lever set is constant.

Clause 8. The method of clause 3, wherein the engagement slot section comprises end points, operable as positive stops and define a closest position between the swappable battery module and the charger base.

Clause 9. The method of clause 3, wherein the bushings are configured to slide out of the extraction slot section thereby separating the rail base from the first slider and from the second slider for complete removal of the swappable battery module from the external charger.

Clause 10. The method of clause 2, wherein: the first slider comprises a rail handle protruding past the second end plate of the swappable battery module, and the rail handle and the swappable battery module move at different speeds or at a same speed relative to the charger base depending on proximity of the first end plate of the swappable battery module to the charger base.

Clause 11. The method of clause 1, wherein: the charger base comprises two charger electric terminals, the first end plate comprises a first electrical terminal and a second electrical terminal, and sliding the swappable battery module further comprises forming electrical connections between each of the first electrical terminal and the second electrical terminal and a corresponding one of the two charger electric terminals.

Clause 12. The method of clause 11, wherein (a) the first electrical terminal and the second electrical terminal are connected to the two charger electric terminals at a same time as (b) the charger fluidic ports are fluidically coupled with the first fluidic port and the second fluidic port.

Clause 13. The method of clause 1, further comprising charging the swappable battery module using the external charger while circulating thermal fluid through the swappable battery module using the external charger such that the thermal fluid flows through each of the first fluid channel, the second fluid channel, the third fluid channel, and the fourth fluid channel.

Clause 14. The method of clause 13, wherein: the thermal fluid is flown from the external charger into the swappable battery module through the first fluidic port of the swappable battery module, the first end plate distributes the thermal fluid into a first portion, directed into the first fluid channel, and a second portion, directed into the third fluid channel, the second end plate receives the first portion of the thermal fluid and redirects the first portion of the thermal fluid into the second fluid channel, the second end plate also receives the second portion of the thermal fluid and redirects the second portion of the thermal fluid into the fourth fluid channel, and the second end plate combines the first portion and the second portion of the thermal fluid and directs the thermal fluid from the swappable battery module and into the external charger through the second fluidic port of the swappable battery module.

Clause 15. The method of clause 1, further comprising removing the battery module from the external charger while decoupling the charger fluidic ports from the first fluidic port and the second fluidic port.

Clause 16. The method of clause 15, wherein: one of the charger fluidic ports and the first fluidic port is a first component while another one of the charger fluidic ports and the first fluidic port is a second component, the first component comprises a first body, a first seal, a first spool, a first seal, a slider, a first slider seal, and a first spring; the first spool is slidably coupled to the first body and to the slider and biased, relative to the first body, by the first spring; the first spool is sealed against the first body by the first seal; the second component comprises a second body, a second seal, a second spool, and a second spring; the second spool is slidably coupled to and biased, by the second spring, relative to the second body; when the charger fluidic ports are fluidically coupled with the first fluidic port and the second fluidic port, the first spool extends into the second body and is sealed against the second body by the second seal; and when the charger fluidic ports are fluidically decoupled from the first fluidic port and the second fluidic port, the first spool is sealed relative to the slider by the first slider seal while the second spool is sealed relative to the second body by the second seal.

Clause 17. The method of clause 16, wherein decoupling the charger fluidic ports from the first fluidic port and the second fluidic port comprises: moving the first body away from the second body such that the first spool is biased by the first spring out of the first body and such that the slider follows the first body and is retracted into the first spool, further moving the first body away from the second body such that the slider follows the first body and is retracted into the first spool and such that the first slider seal is sealed against the first spool thereby preventing a thermal fluid from flowing between a cavity inside the slider and a space between the slider and the second body, further moving the first body away from the second body such that the first slider seal remains sealed against the first spool thereby preventing flow of the thermal fluid and such that the first spool is no longer being pushed out of the first body and such that the first spool is now extracted from the second body, and further moving the first body away from the second body such that the first slider seal remains sealed against the first spool thereby preventing the flow of the thermal fluid, such that the first spool continues being extracted from the second body, and such that the second seal disengages the first spool and engages the second spool.

Clause 18. The method of clause 1, wherein: the prismatic battery cells comprise cell terminals, the swappable battery module further comprises bus bars forming at least a first bus-bar row and a second bus-bar row and interconnecting the cell terminals, the first bus-bar row extends within the first fluid channel, the second bus-bar row extends within the second fluid channel, and the cell terminals, the first bus-bar row, and the second bus-bar row are submerged and immersively cooled by a thermal fluid flows through and between the first fluidic port and the second fluidic port.

Clause 19. The method of clause 18, wherein: the bus bars form at least a third bus-bar row extending within the second fluid channel, one of the bus bars in the first bus-bar row is electrically coupled to a first electrical terminal of an end cell of the prismatic battery cells, and one of the bus bars in the third bus-bar row is electrically coupled to a second electrical terminal of the end cell of the prismatic battery cells.

Clause 20. The method of clause 1, wherein: a thermal fluid flows through and between the first fluidic port and the second fluidic port, and the thermal fluid is a transformer oil.

BRIEF DESCRIPTION OF THE DRAWINGS

FIGS. 9A-9E illustrate bottom views of a module support rail and a swappable battery module at different stages while removing the swappable battery module from an external charger, in accordance with some examples.

DETAILED DESCRIPTION

Figure 1:
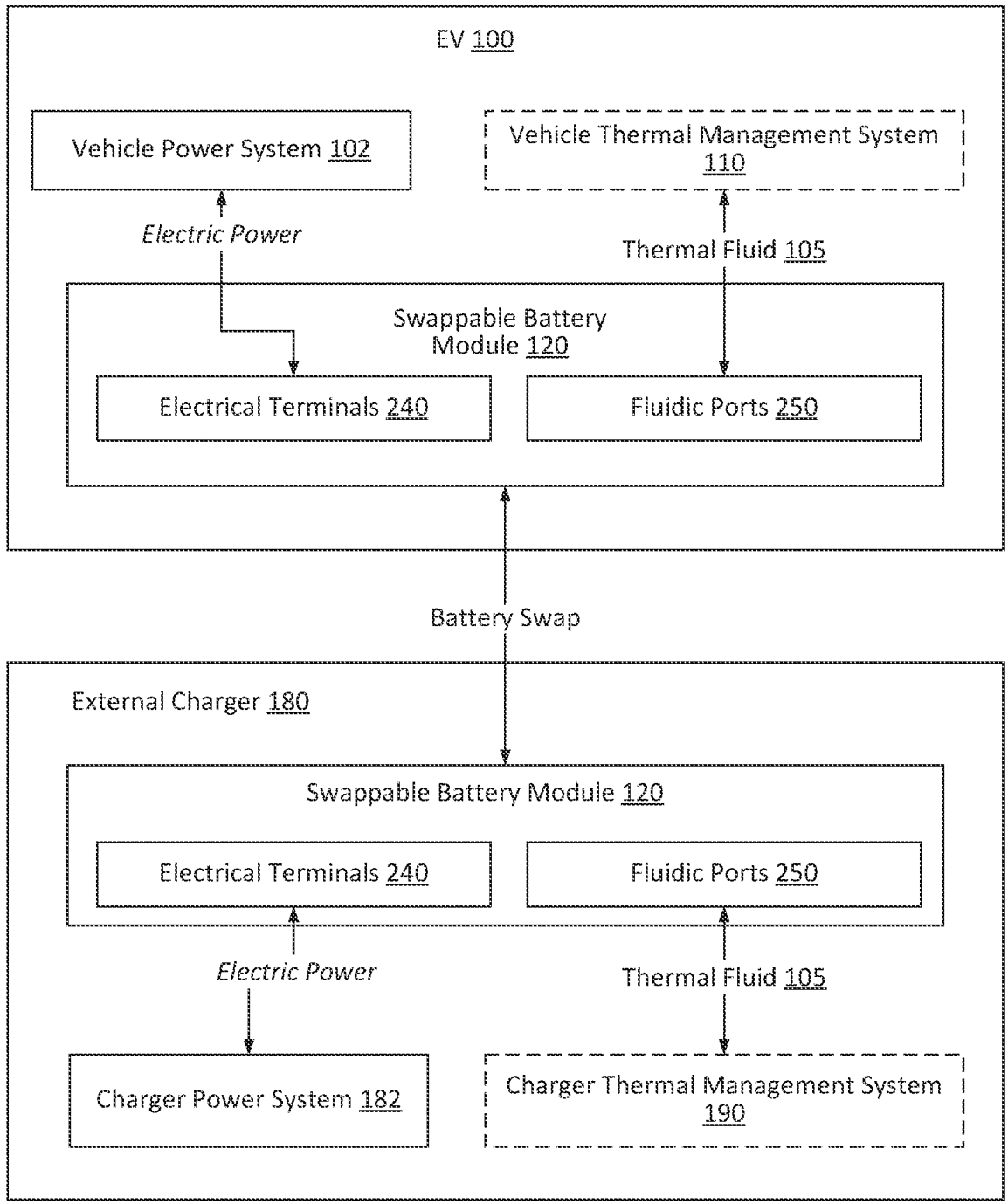
FIG. 1 is a block diagram of a system comprising an electric vehicle, an external charger, and a swappable battery module that can be interchangeably connected to either the electric vehicle or the external charger, in accordance with some examples.

In the following description, numerous specific details are outlined to provide a thorough understanding of the present invention. The present invention may be practiced without some or all of these specific details. In other instances, well-known process operations have not been described in detail to avoid obscuring the present invention. While the invention will be described in conjunction with the specific examples, it will be understood that it is not intended to limit the invention to the examples.

INTRODUCTION

As noted above, battery cells can be very sensitive to operating temperatures. At the same time, these temperatures can be influenced by the environment and/or by the cells' operation (e.g., self-heating during fast charge/discharge). Liquid-based thermal management provides efficient ways to control the temperature of battery cells. However, the thermal coupling of battery cells and thermal fluid can be challenging. The immersion cooling of battery cells brings battery cells in direct contact with thermal fluids, which is beneficial for thermal transfer (in comparison to positioning intermediate structures between the cells and thermal fluids, e.g., to enclose the thermal fluid). The key challenges include controlling the distribution and flow of thermal fluids around battery cells and other components (e.g., bus bars).

Described herein are swappable battery modules comprising immersion-thermally controlled prismatic battery cells and methods of operating thereof. Specifically, each battery cell comes in direct contact with a thermal fluid (e.g., transformer oil) at multiple locations, e.g., two locations on the first surface of these battery cells and two additional locations on the second surface, opposite of the first surface. Furthermore, the thermal fluid is circulated in such a way that all experience substantially the same heat transfer driven by the temperature difference between the cells and fluid. Furthermore, even when the thermal fluid is not circulated, the fluid remaining in the swappable battery module provides an additional thermal mass and thermal pathways between the cells and other components of the swappable battery modules. For example, at certain operating conditions (e.g., discharge/charge rates of at or less than 5 C, at or less than 2 C, or even at or less than 1 C), no circulation of the thermal fluid may be provided. Specifically, no fluid circulating may be provided while a batter module is positioned on a vehicle. However, at higher discharge/charge rates (e.g., at or greater than 5 C, at or greater than 8 C, or even at or greater than 10 C), the thermal fluid can be circulated through the module (e.g., when the module is connected to an external charger thereby enabling high charge rates). Specifically, the thermal fluid may be circulated through the swappable battery module as well as between the module and an external cooling system, wherein the thermal fluid is cooled before being returned to the module. It should be noted that immersion-thermally control may involve cooling and/or heating.

In some examples, battery cells are glued together for the structural integrity of the resulting swappable battery module. The adhesive layers provided between the cells can also be used for the electrical isolation of battery cells and, to some extent, for thermal isolation of the cells (both of which are safety measures). Furthermore, the direct attachment of the battery cells effectively provides some internal structural support (e.g., a module skeleton) and reduces the structural requirements from the external components, thereby reducing the weight/size of these components (and increasing the gravimetric/volumetric capacity of the module). External support is provided by an enclosure.

Swappable battery modules described herein can be used to power electric vehicles and can be charged using external chargers. FIG. 1 is a schematic block diagram illustrating swappable battery module 120 being swapped between electric vehicle 100 (to power electric vehicle 100) and external charger 180 (to recharge swappable battery module 120). Hence swappable battery module 120 may be also referred to as a swappable battery module 120. For purposes of this disclosure, the terms "swappable battery module" and "swappable battery module" are used interchangeably. Furthermore, the swappable battery module 120 may also be referred to as an immersion-thermally controlled swappable battery module since the cells within the module are in direct contact with the thermal fluid as described below.

While on electric vehicle 100, swappable battery module 120 is electrically connected to vehicle power system 102, e.g., inverters, electric motors, and other like devices. Various types of electric vehicles 100 (e.g., tractors, rugged terrain vehicles (RTVs), all-terrain vehicles (ATVs), industrial electric vehicles such as loaders, forklifts, and the like) are within the scope. In some examples, swappable battery module 120 can also be fluidically connected to vehicle thermal management system 110, which allows circulating thermal fluid 105 between vehicle thermal management system 110 and swappable battery module 120. Vehicle thermal management system 110 is optional and, in some examples, swappable battery module 120 does not form any fluidic connections to any systems on electric vehicle 100. When such a connection is formed, the circulation of thermal fluid 105 can be used to control the temperature of swappable battery module 120 or, more specifically, the temperature of the battery cells forming this swappable battery module 120. For example, electric vehicle 100 (e.g., snowmobiles, ATVs) can be operated at environmental temperatures that are outside of the desired cell temperature range. In the same or other examples, the power demand from vehicle power system 102 can cause significant heating of the battery cells (e.g., exceeding the environmental cooling rate of the swappable battery module 120). Vehicle thermal management system 110 can be configured to provide thermal fluid 105 at a desired temperature range (e.g., between 10° ° C. and 30°) to assist with cooling and/or heating of swappable battery module 120. In some examples, vehicle thermal management system 110 is equipped with one of a heat pump, a heater, a radiator, and the like.

While on external charger 180, the swappable battery module 120 is electrically connected to charger power system 182. In some examples, swappable battery module 120 can also be fluidically connected to charger thermal management system 190. Charger thermal management system 190 is optional and, in some examples, the swappable battery module 120 does not form any fluidic connections to any systems on the external charger 180. When such a connection is formed, this connection allows circulating thermal fluid 105 between the charger thermal management system 190 and the swappable battery module 120. As noted above, this circulation of thermal fluid 105 can be used to control the temperature of the swappable battery module 120 or, more specifically, the temperature of the battery cells forming this swappable battery module 120. In addition to environmental temperature considerations, this circulation allows the use of high charge rates (e.g., greater than 2 C, greater than 5 C, and even as high as 10 C or greater) without the risk of overheating the cells. Charge currents (similar to discharge currents) caused the internal cell heating. The circulation of thermal fluid 105 allows for the efficient removal of this generated heat thereby allowing higher charge rates and faster charging. In some examples, the charger thermal management system 190 is equipped with one of a heat pump, a heater, a radiator, and the like. Examples of fluidic connections are described below with reference to FIGS. 5A-5F.

The swappable battery module 120 comprises electrical terminals 240 to form the above-referenced electrical connections. The same set of electrical terminals 240 is used for connection to both vehicle power system 102 and charger power system 182. Furthermore, the swappable battery module 120 comprises fluidic ports 250 to form the above-referenced fluidic connections, e.g., to at least one of vehicle thermal management system 110 and charger thermal management system 190. These and other features of swappable battery module 120 will now be described with reference to FIGS. 2A-2L and FIG. 3A-3B.

Examples of Swappable Immersion-Thermally Controlled Swappable Battery Modules

Figure 2A:
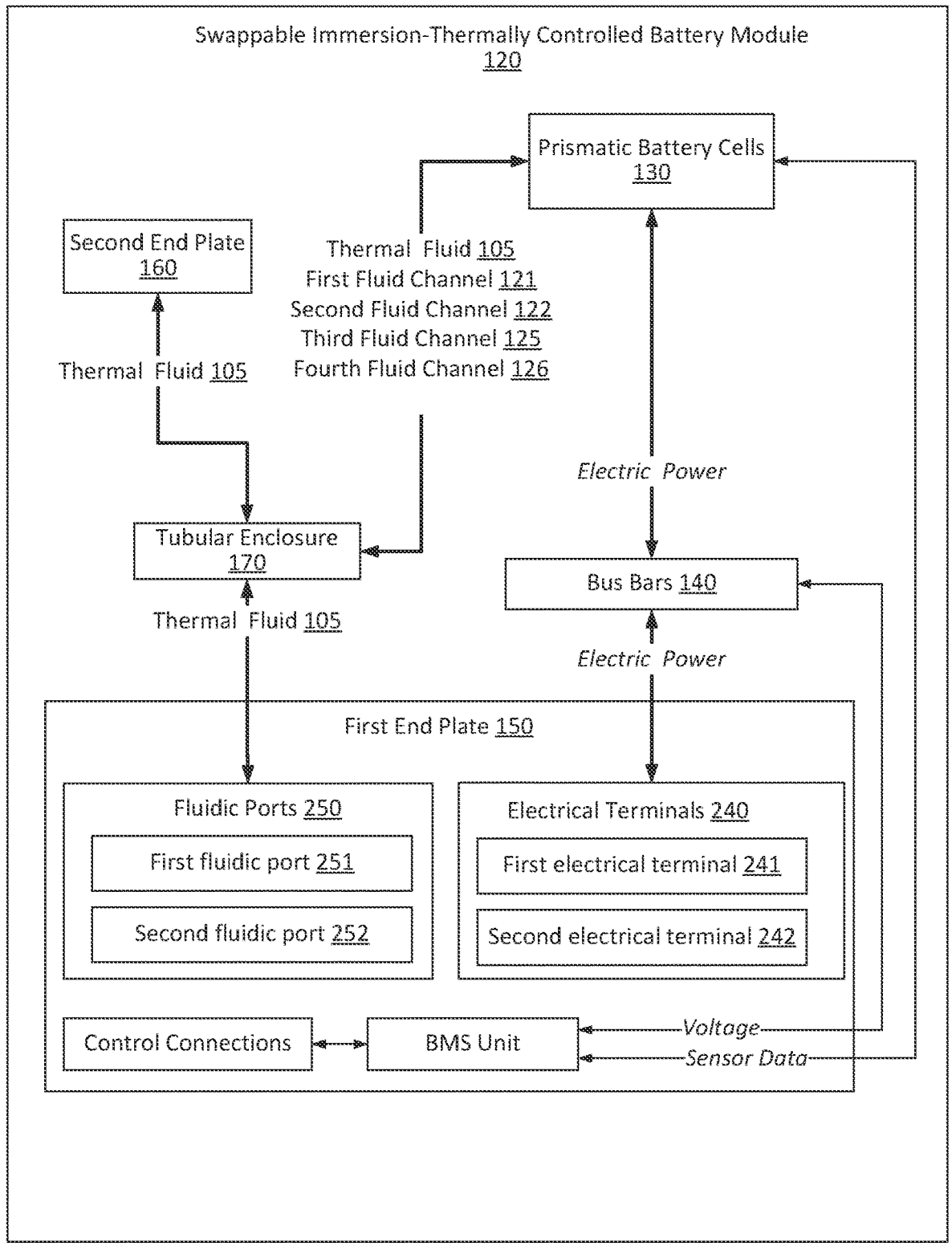
FIG. 2A is a block diagram of a swappable battery module, in accordance with some examples.
Figure 2B:
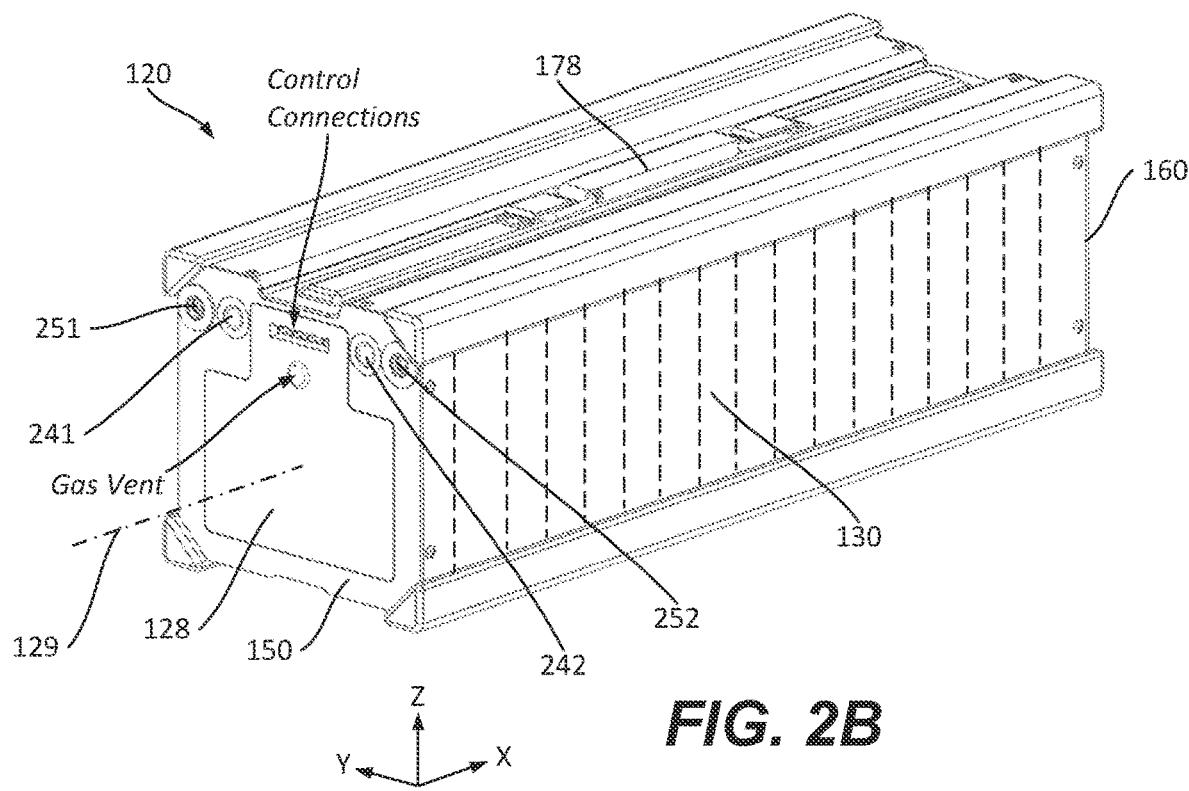
FIG. 2B is a schematic illustration of a swappable battery module comprising immersion-thermally controlled battery cells, in accordance with some examples.

FIG. 2A is a block diagram of swappable battery module 120, illustrating various module components as well as mechanical and functional connections among these components, in accordance with some examples. FIG. 2B is a schematic perspective view of swappable battery module 120 in FIG. 2A. Swappable battery module 120 comprises immersion-thermally controlled battery cells 130 forming one or more stacks inside swappable battery module 120. Specifically, in the view of FIG. 2B, prismatic battery cells 130 (schematically identified using dashed lines) are hidden by other components such as tubular enclosure 170, first end plate 150, and second end plate 160. A combination of tubular enclosure 170, first end plate 150, and second end plate 160 enclose prismatic battery cells 130 and isolate prismatic battery cells 130 from the environment. Furthermore, this combination of tubular enclosure 170, first end plate 150, and second end plate 160 provide the immersion thermal control to prismatic battery cells 130 by containing thermal fluid 105 within various fluid channels formed by these components and prismatic battery cells 130 as further described below.

Figure 2C:
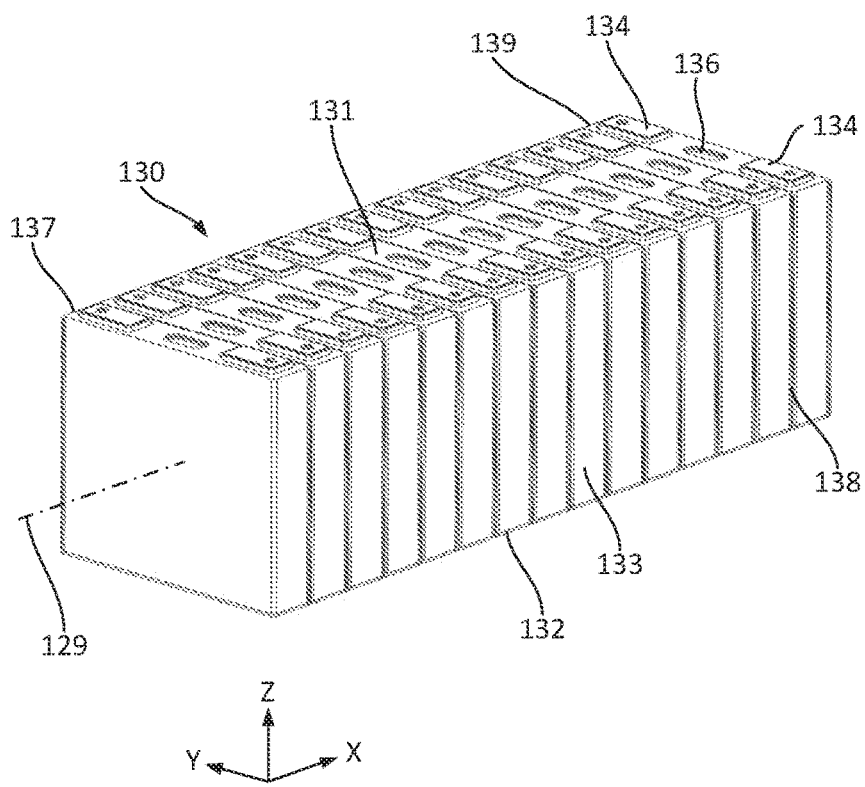
FIG. 2C is a schematic perspective view of a stack of prismatic battery cells for use in a swappable battery module, in accordance with some examples.

FIG. 2C is a schematic perspective view of a stack of prismatic battery cells 130, in accordance with some examples. Specifically, tubular enclosure 170, first end plate 150, and second end plate 160 are not shown in FIG. 2C. One having ordinary skill in the art would understand that any number of cells can be used in one swappable battery module 120. Battery cells 130 used in swappable battery module 120 are prismatic, rather than cylindrical. Prismatic battery cells 130 can be packed more compactly (with fewer spaces in between cells) within swappable battery module 120 resulting in a higher density of swappable battery module 120. For purposes of this description, a prismatic battery cell is defined as a cell having the shape of a rectangular prism (as opposed to a cylinder). As such, a prismatic battery cell has three distinct dimensions: (a) height, (b) width, and (c) thickness. In some examples, the height of prismatic battery cell 130 (used in swappable battery module 120) is between 50 millimeters and 200 millimeters or, more specifically, between 75 millimeters and 125 millimeters. In the same or other examples, the width of prismatic battery cell 130 (used in swappable battery module 120) is between 50 millimeters and 200 millimeters or, more specifically, between 75 millimeters and 125 millimeters. In some examples, the thickness of prismatic battery cell 130 (used in swappable battery module 120) is between 5 millimeters and 50 millimeters or, more specifically, between 10 millimeters and 30 millimeters. The number and size of battery cells 130 also define the size and weight of swappable battery module 120. In some examples, swappable battery module 120 has a weight of between 5 kilograms and 50 kilograms or, more specifically, between 10 kilograms and 40 kilograms, such as between 15 kilograms and 30 kilograms. While a heavier module can provide more charge energy, it is much harder to handle and swap heavier modules. In general, the weight of swappable battery module 120 is selected to be swappable by a human.

Prismatic battery cells 130 can be of various chemistry types, e.g., nickel-manganese-cobalt (NMC), lithium iron phosphate (LFP), and lithium titanate (LTO), at least based on the composition of positive electrodes. For example, lithium titanate (LTO) cells can support high charge-discharge rates, which may be particularly useful for industrial applications such as electric tractors, loaders, and the like.

Referring to FIGS. 2B and 2C, prismatic battery cells 130 are stacked along primary axis 129 of the swappable battery module 120 (which extends substantially parallel to the X-axis in these figures). While FIG. 2C illustrates one cell stack, the same swappable battery module 120 may include multiple different cell stacks (e.g., positioned next to each other). Prismatic battery cells 130 comprise first surfaces 131, second surfaces 132 opposite to first surfaces 131, and side surfaces 133 extending between first surfaces 131 and second surfaces 132. For example, each first surface 131, second surface 132, and side surface 133 can be substantially parallel to primary axis 129. In some examples, each of prismatic battery cells 130 has a height, length, and thickness such that the thickness is less than the height and less than the length and such that the thickness is parallel to primary axis 129 of the swappable battery module 120. Prismatic battery cells 130 can be stacked along their thicknesses.

Prismatic battery cells 130 also comprise cell terminals 134 positioned on first surfaces 131. Cell terminals 134 are used to form electrical connections to prismatic battery cells 130. In some examples, cell terminals 134 are isolated from the other external components (e.g., the case, lid) of prismatic battery cells 130 such that these components are neutral. In some examples, prismatic battery cells 130 comprise pressure-release burst valves 136 configured to release gases from the interior of prismatic battery cells 130 when the pressure inside prismatic battery cells 130 exceeds a set threshold. In more specific examples, pressure-release burst valve 136 of each prismatic battery cell 130 is positioned between cell terminals 134 of that cell.

Figure 2D:
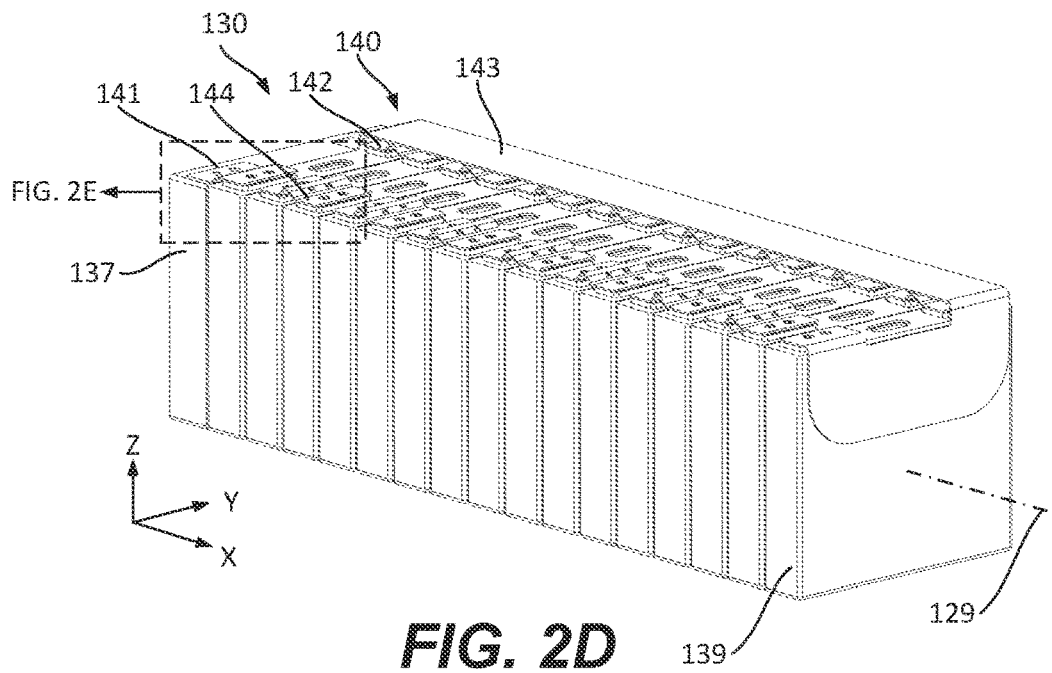
FIG. 2D is a schematic perspective view of the prismatic battery cells in FIG. 2C with three sets of bus bars attached to the cells, in accordance with some examples.
Figure 2E:
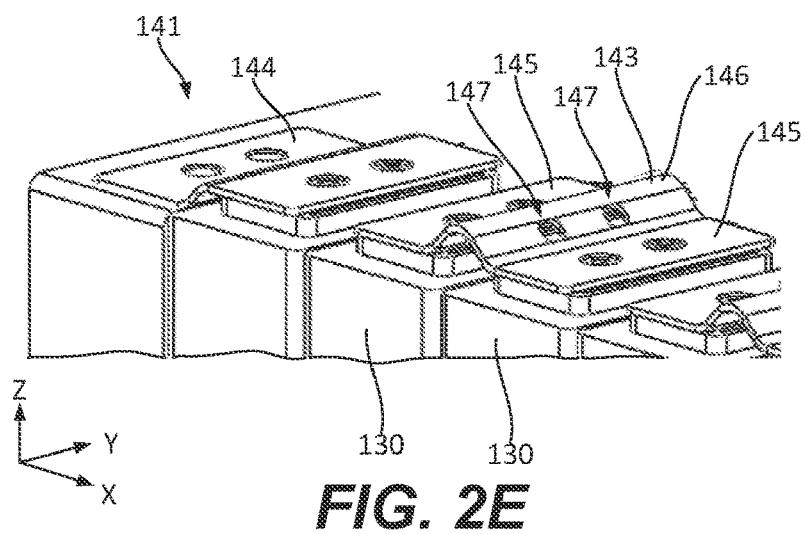
FIG. 2E is a schematic expanded view of FIG. 2D illustrating two disjoined bus bar components, in accordance with some examples.
Figure 2F:
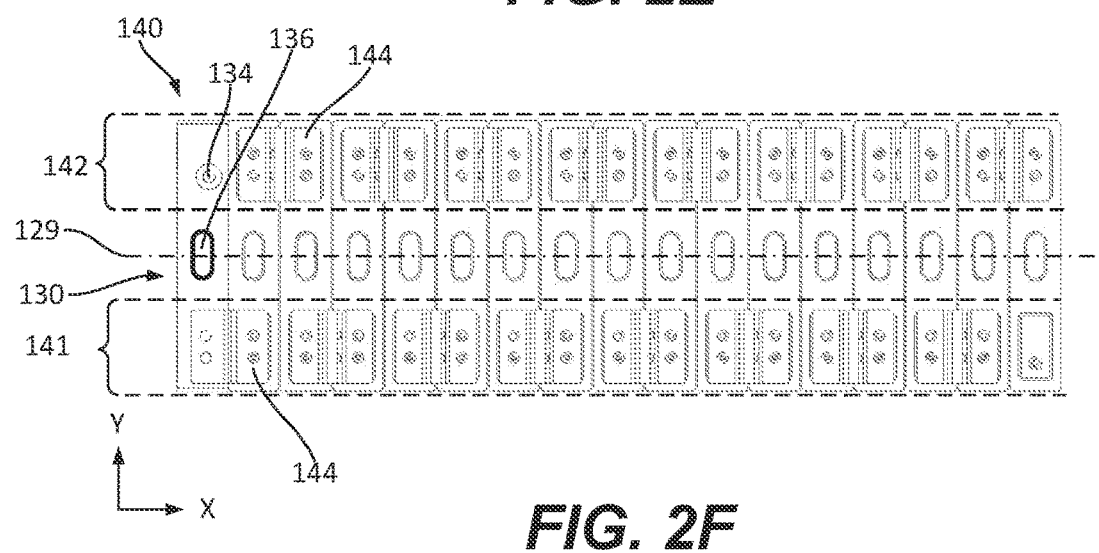
FIG. 2F is a schematic top view of the prismatic battery cells in FIG. 2C with two sets of bus bars (and no return bus bar) attached to the cells, in accordance with some examples.
Figure 2G:
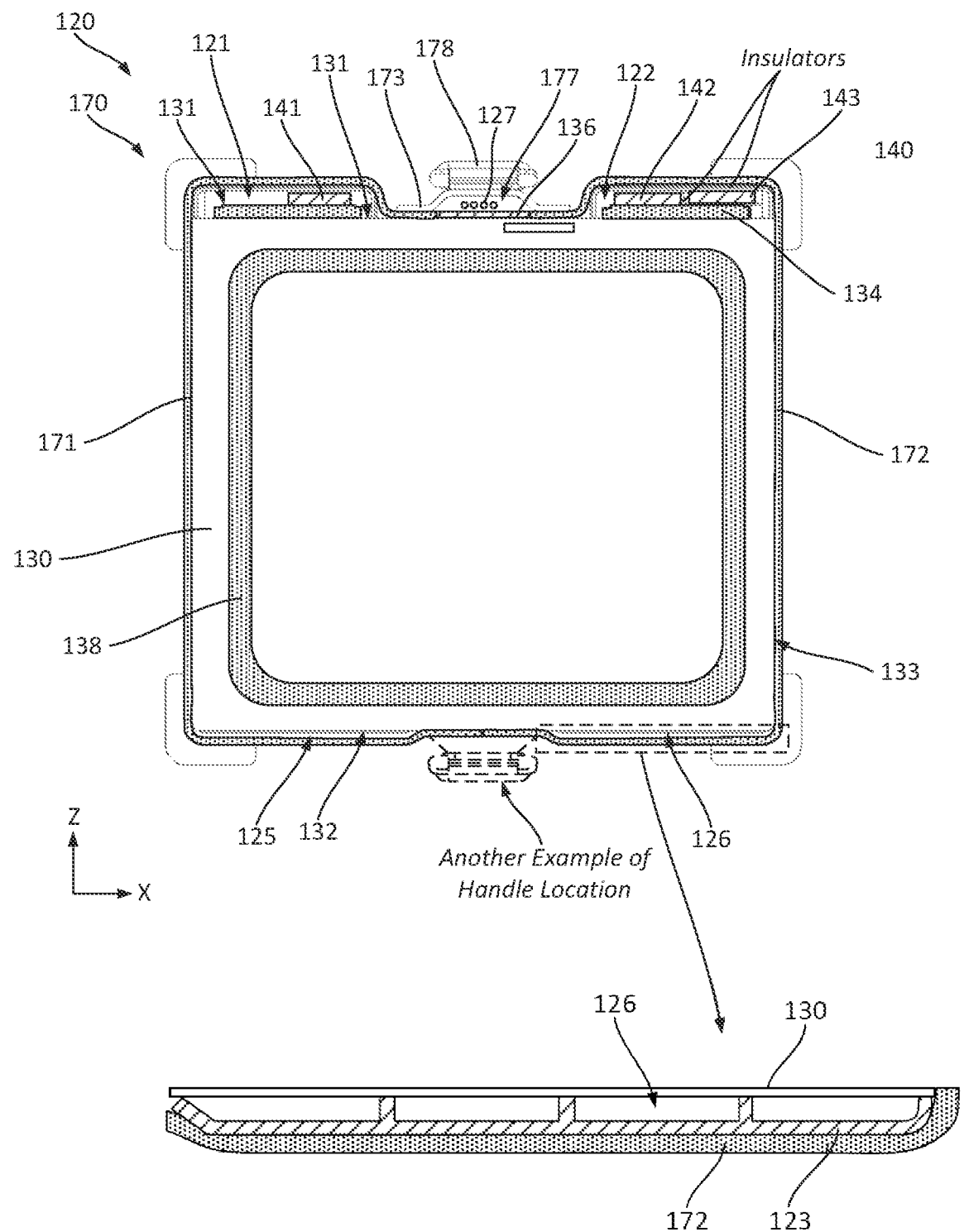
FIG. 2G is a schematic cross-sectional view of a swappable battery module illustrating fluidic channels formed by the tubular enclosure and cells, in accordance with some examples.
Figure 2H:
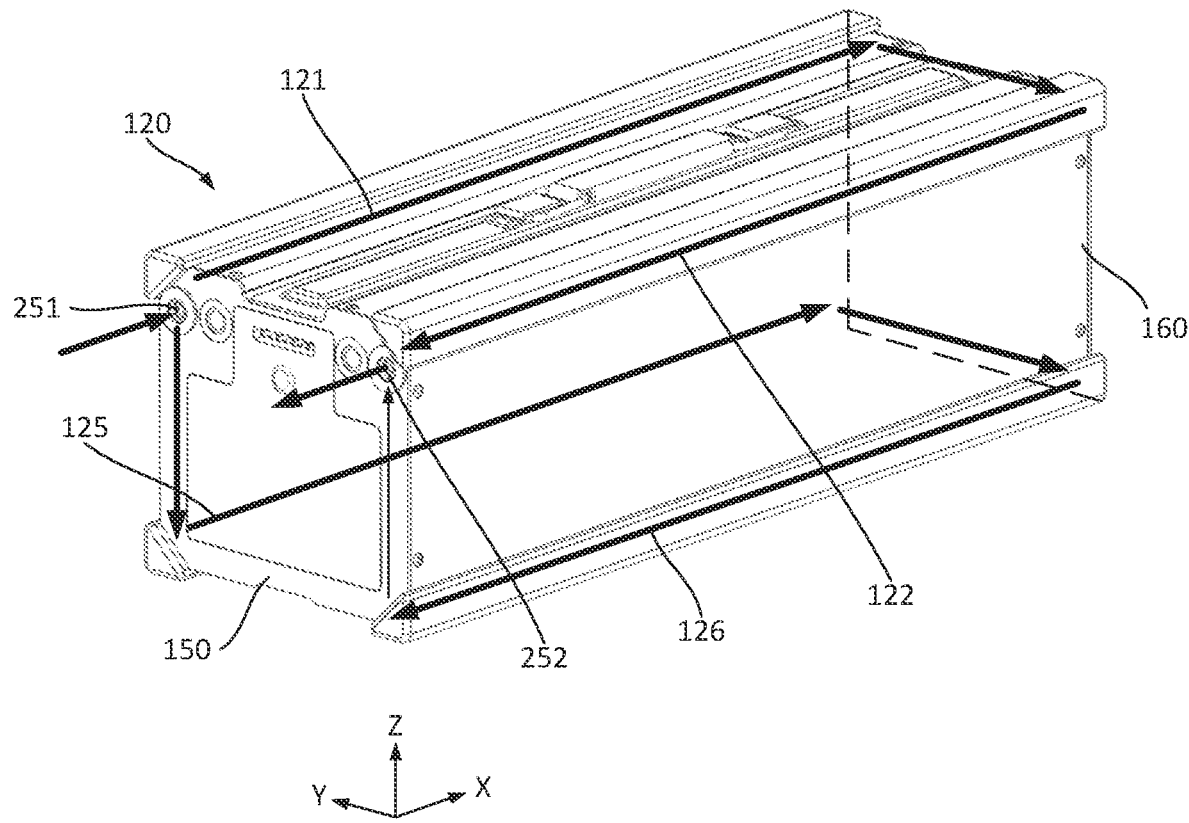
FIGS. 2H and 2I are schematic views of a swappable battery module illustrating fluidic pathways through the module, in accordance with some examples.
Figure 2I:
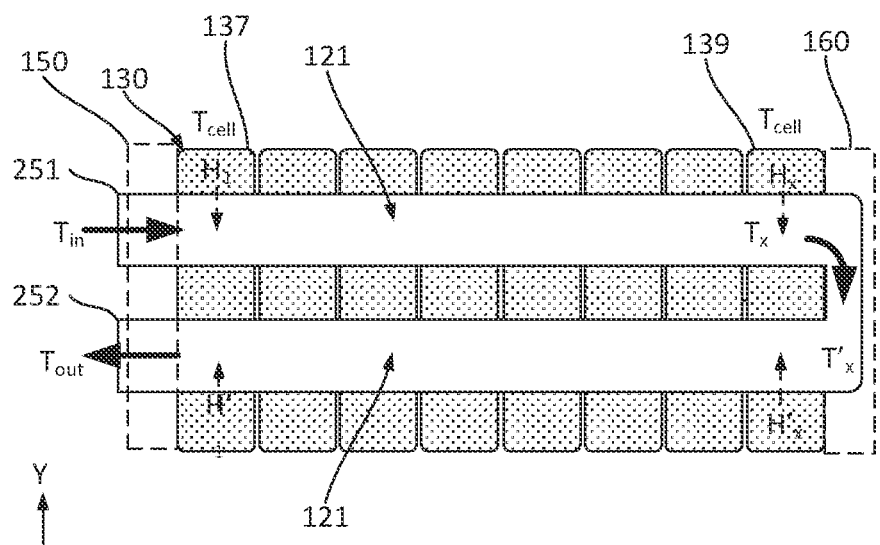

Referring to FIGS. 2C and 2I, in some examples, two adjacent prismatic battery cells 130 are mechanically interconnected by an adhesive layer 138 extending between prismatic battery cells 130 in each adjacent pair. Some examples of adhesive layer 138 include but are not limited to epoxy and polyurethane. The thickness of adhesive layer 138 can be used to accommodate variations in the cell thicknesses. For example, a pair of thin cells may have a thicker adhesive layer, while a pair of thick cells may have a thinner adhesive layer, such that the combined thickness is the same regardless of the cell thicknesses. Furthermore, flexible adhesives can be compressible and used to accommodate cell swelling (if any) during the operation of swappable battery module 120. In some examples, adhesive layers 138 also provide electrical insulations between adjacent cells (e.g., even though the sides of battery cells 130 can be substantially neutral). In these examples, adhesive layers 138 are continuous sheets extending between battery cells 130 to tubular enclosure 170. Alternatively, adhesive layers 138 have an annulus shape, e.g., as shown in FIG. 2I to accommodate swelling of prismatic battery cells 130 that tend to swell more in the center/away from the edges.

Adhesive layers 138 provide attachment/bonding between prismatic battery cells 130 in the set adding to the overall structural integrity of swappable battery module 120. In other words, a combination of prismatic battery cells 130 and adhesive layers 138 is operable as an internal structural element (which can be referred to as a "skeleton") of the swappable battery module 120. Other components of swappable battery module 120, e.g., first end plate 150, second end plate 160, and tubular enclosure 170 are operable as an internal structural element ("exoskeleton"). Furthermore, adhesive layers 138 provide electrical isolation and, in some examples, thermal isolation of adjacent prismatic battery cells 130. While the cases of prismatic battery cells 130 can be neutral, the electrical isolation can help to improve the overall module safety (e.g., when internal shorts develop in one or more prismatic battery cells 130).

Referring to FIGS. 2D-2E, swappable battery module 120 comprises bus bars 140 interconnecting cell terminals 134. Bus bars 140 can be made from copper, aluminum, nickel, and other suitable conductive materials. While FIGS. 2D and 2F illustrate one example of cell connections (i.e., 17s connection scheme, in which each 17 prismatic battery cells 130 are interconnected in series), other examples are also within the scope. The connection scheme depends on the required voltage output of swappable battery module 120 and other like factors.

In some examples, bus bars 140 comprise a plurality of disjoined components 144, forming first bus-bar row 141 and second bus-bar row 142, e.g., as shown in FIG. 2E where return bus bar 143 is not shown/hidden). Furthermore, bus bars 140 can include return bus bar 143, used for positioning both electric terminals of the swappable battery module 120 on the same side (e.g., first end plate 150). Return bus bar 143 can be connected to one cell (e.g., second-end cell 139 in FIG. 2D) and one electric terminal (not shown in FIG. 2D). Return bus bar 143 extends over battery cells 130 without making any other electrical connections to battery cells 130 or other components of bus bars 140.

Referring to FIG. 2E, in some examples, one example of disjoined components 144 comprises two planar portions 145 and interconnecting rib 146, joining two planar portions 145. Two planar portions 145 are connected to cell terminals 134 of two adjacent battery cells 130. Interconnecting rib 146 can protrude from two planar portions 145 and in the direction away from battery cells 130, e.g., to provide in-plane movement flexibility between planar portions 145 (e.g., along the X-axis to accommodate the swelling of adjacent battery cells 130 corresponding to changing the distance between the attachment points between these cells and planar portions 145. It should be noted that interconnecting rib 146 protrudes into a fluidic channel and can (at least partially) block the fluidic path. As such, interconnecting rib 146 comprises one or fluid path openings 147 to assist with this flow. Furthermore, interconnecting rib 146 can assist with the mixing of thermal fluid 105 within the channel thereby enhancing the thermal transfer characteristics.

Referring to FIG. 2F, bus bars 140 in first bus-bar row 141 are connected to cell terminals 134 having one polarity (e.g., positive cell terminals), while bus bars 140 in second bus-bar row 142 are connected to cell terminals 134 having the other polarity (e.g., negative cell terminals). Further connections are provided through battery cells 130. Since cell terminals 134 are positioned on first surfaces 131, bus bars 140 are also positioned next to first surfaces 131.

It should be noted that during the operation of the swappable battery module 120, bus bars 140 are immersion-thermally controlled as further described below. As such, the cross-section of bus bars 140 can be reduced in comparison to bus bars that are not thermally controlled thereby allowing some resistive heating within bus bars 140. For example, the temperature coefficient of copper is about 0.00404 $C^{-1}$. Therefore, increasing the temperature of copper bus bars by 50° C. will cause the resistivity to increase by about 20%. Without the temperature control of bus bars 140, the dimensions of bus bars 140 need to accommodate the highest operating temperature. It should be noted that the heating of bus bars 140 can be caused by receiving the heat from battery cells 130 and from the internal resistive heating. However, increasing the size of bus bars 140 (to accommodate for higher operating temperatures) is highly undesirable since this increases the weight and size of bus bars 140 (and as a result of swappable battery module 120). Furthermore, bus bars 140 can be used (in addition to thermal fluid 105) for transferring the heat between battery cells 130.

Referring to FIG. 2G, tubular enclosure 170 is attached to each of the first surfaces 131, second surfaces 132, and side surfaces 133 of prismatic battery cells 130. Tubular enclosure 170 forms the first fluid channel 121 and second fluid channel 122 with a portion of the first surfaces 131. Similarly, tubular enclosure 170 forms third fluid channel 125 and fourth fluid channel 126 with a portion of second surfaces 132. These fluid channels are used for circulating thermal fluid 105 through swappable battery module 120 and, more specifically, for direct contact between thermal fluid 105 and prismatic battery cells 130 thereby establishing immersion thermal transfer between thermal fluid 105 and prismatic battery cells 130 (e.g., immersion cooling). In some examples, one or more fluid channels comprise channel inserts 123, e.g., as shown in the expanded view of the fourth fluid channel 126 at the bottom of FIG. 2G. For example, channel inserts 123 can provide support to the tubular enclosure 170 relative to the prismatic battery cells 130 as well as other components positioned within the channels (e.g., bus bars 140). Furthermore, channel inserts 123 can control the fluidic paths, flow rates, and other aspects associated with immersion cooling.

Overall, each prismatic battery cell 130 is immersed/comes in contact with the thermal fluid provided in all four fluid channels, i.e., first fluid channel 121, second fluid channel 122, third fluid channel 125, and fourth fluid channel 126. Each prismatic battery cell 130 is thermally controlled (e.g., immersion-cooled and/or immersion-heated) from the first surface 131 and second surface 132 thereby ensuring more a uniform temperature profile within prismatic battery cell 130 (e.g., in comparison to one-sided cooling of battery cells). Furthermore, the first fluid channel 121 and second fluid channel 122 are also used for cooling bus bars 140. For example, the first bus-bar row 141 protrudes into the first fluid channel 121 while the second bus-bar row 142 protrudes into the second fluid channel 122.

FIG. 2H illustrates one example of the fluidic flow paths within a swappable battery module 120. Specifically, the first end plate 150 comprises first fluidic port 251 and second fluidic port 252. Thermal fluid 105 can enter swappable battery module 120 through first fluidic port 251. First fluidic port 251 is fluidically coupled to both first fluid channel 121 and third fluid channel 125. Thereby, thermal fluid 105 is directed from first fluidic port 251 in both first fluid channel 121 and third fluid channel 125. When thermal fluid 105 flows through first fluid channel 121, thermal fluid 105 comes in contact with first surfaces 131 of battery cells 130 (or, more specifically, portions of these surfaces). Similarly, when thermal fluid 105 flows through third fluid channel 125, thermal fluid 105 comes in contact with second surfaces 131 of battery cells 130 (or, more specifically, portions of these surfaces). Once thermal fluid 105 reaches second end plate 160, a portion of thermal fluid 105 from first fluid channel 121 is redirected to second fluid channel 122, while the other portion of thermal fluid 105 from third fluid channel 125 is redirected to fourth fluid channel 126. As further described below, second end plate 160 fluidically interconnects first fluid channel 121 and third fluid channel 125. Second end plate 160 also fluidically interconnects second fluid channel 122 and fourth fluid channel 126 (independently from first fluid channel 121 and third fluid channel 125). Thermal fluid 105 then flows through second fluid channel 122 and again comes in contact with first surfaces 131 of battery cells 130 (now with different portions of these surfaces). Similarly, the other portion of thermal fluid 105 flows through fourth fluid channel 126 and comes in contact with second surfaces 131 of battery cells 130 (again with different portions of these surfaces). Second fluidic port 252 is fluidically coupled to both second fluid channel 122 and fourth fluid channel 126 and receives thermal fluid 105 from both of these channels, after which thermal fluid 105 is discharged from batter module 120 through second fluidic port 252.

Referring to FIG. 2I, as the thermal fluid having an inlet temperature ($T_{in}$) enters swappable battery module 120, the thermal fluid receives the heat ($H_1$) and increases the fluid temperature as the fluid continues to flow through the module. For example, upon reaching the last cell in this series (second-end cell 139), the fluid temperature ($T_x$) will be higher that the inlet temperature ($T_x > T_{in}$). Assuming that all battery cells have the same temperature ($T_{cell}$), the first cell (first-end cell 137) that comes in contact with the immediately incoming (colder) fluid will lose more heat than any subsequent cell in this series since the heat transfer is proportional to the temperature gradient between the cell and the fluid. For example, the heat transfer from the last cell in this series ($H_x \propto T_{cell} - T_x$) will be smaller than the heat transfer from the first cell in this series ($H_1 \propto T_{cell} - T_{in}$) due to the thermal fluid heating and the thermal gradient reduction ($T_{in} < T_x \rightarrow H_1 > H_x$). If the thermal fluid is not looped and allowed to exit on the other side of the swappable battery module, then the first cell will be cooled more than the last cell. However, when the thermal fluid is looped and has both first fluid channel 121 and second fluid channel 122 (both providing fluidic contact to each cell), there is additional heat transfer occurs from each cell. Specifically, the heat transfer provided by first fluid channel 121 is described above resulting in the first cell will be cooled more than the last cell. However, as the thermal fluid is directed from first fluid channel 121 to second fluid channel 122, the order of the cell experiencing the flow is flipped while the thermal fluid continues to heat. The last cell sees this return flow first and experiences additional heat transfer ($H'_x \propto T_{cell} - T'_x$). The first cell sees this return flow last and also experiences additional heat transfer ($H'_1 \propto T_{cell} - T'_{out}$). Since the thermal fluid continues to heat ($T_{out} > T'_x$), the last cell is now cooled more ($H'_x > H'_1$). Combining the two heat transfers (provided by first fluid channel 121 to second fluid channel 122), the total heat transfer is more balanced ($H_x + H'_x \sim H_1 + H'_1$) than the heat transfer provided by each of the channels individually. While the above example is provided for cells' cooling, one having ordinary skill in the art would understand how the same concept applies to cells' heating.

Returning to FIG. 2G, first fluid channel 121 and third fluid channel 125 are formed by tubular enclosure 170 with a portion of first surfaces 131. Similarly, third fluid channel 125 and fourth fluid channel 126 are formed by tubular enclosure 170 with a portion of second surfaces 132. In this example, first bus-bar row 141 extends within first fluid channel 121. In other words, both first surfaces 131 of battery cells 130 and first bus-bar row 141 can be thermally controlled (e.g., cooled and/or heated) while thermal fluid 105 flows through third fluid channel 125. First bus-bar row 141 is connected to cell terminal 134. A portion of tubular enclosure 170 can be protected from contacting first bus-bar row 141 and cell terminal 134 by an insulator, thereby maintaining the electric neutrality of tubular enclosure 170. In this illustrated example, second bus-bar row 142 extends within second fluid channel 122. Furthermore, return bus bar 143 (if one is present) can extend through either first fluid channel 121 or second fluid channel 122. Return bus bar 143 may be operable as a return bus bar as described above.

Referring to FIG. 2G, in some examples, tubular enclosure 170 comprises first enclosure portion 171 and second enclosure portion 172, each independently attached to each of first surfaces 131, second surfaces 132, and side surfaces 133 of prismatic battery cells 130. Each of first enclosure portion 171 and second enclosure portion 172 is also independently attached to each of first end plate 150 and second end plate 160 (not shown in FIG. 2F). Each of first enclosure portion 171 and second enclosure portion 172 can be independent monolithic components (e.g., a shaped metal sheet). However, these portions are not monolithic with each other. Separating tubular enclosure 170 into first enclosure portion 171 and second enclosure portion 172 simplified the assembly of swappable battery module 120, e.g., positioning battery cells 130 with tubular enclosure 170. In some examples, each of first enclosure portion 171 and second enclosure portion 172 is glued to each of first surfaces 131, second surfaces 132, and side surfaces 133 of prismatic battery cells 130. Similarly, each of first enclosure portion 171 and second enclosure portion 172 can be glued to each of first end plate 150 and second end plate 160.

Referring to FIG. 2G, in some examples, tubular enclosure 170 further comprises interconnecting portion 173, attached to each of first enclosure portion 171 and second enclosure portion 172 and forming gas-ventilation channel 177 with first surfaces 131 of prismatic battery cells 130. Interconnecting portion 173 effectively interconnects (bridges) first enclosure portion 171 and second enclosure portion 172 while extending above first surfaces 131 of prismatic battery cells 130. In some examples, interconnecting portion 173 is glued to each of first enclosure portion 171 and second enclosure portion 172. As noted above, prismatic battery cells 130 comprise pressure-release burst valves 136 positioned on first surfaces 131. These pressure-release burst valves 136 are in fluid communication with gas-ventilation channel 177.

In case one or more prismatic battery cells 130 experience internal over-pressurization, the corresponding pressure-release burst valves 136 open and release internal gases (and possibly other matter) from these cells into gas-venting channel 177 thereby allowing to depressurize the cells. In some examples, gas-venting channel 177 is fluidically isolated from other components, e.g., bus bars 140, thereby preventing further propagation of unsafe conditions and even potentially continuing the operation of swappable battery module 120. In some examples, one or both of first end plate 150 and second end plate 160 comprise burst valves to vent gases from swappable battery module 120 (e.g., when the pressure inside gas-venting channel 177 exceeds a set threshold).

In some examples, swappable battery module 120 further comprises sensor wires 127, functionally coupled to each of prismatic battery cells 130 and protruding within gas-ventilation channel 177 to first end plate 150. For example, sensor wires 127 can be coupled to cell terminals 134 and/or bus bar portions (e.g., used for voltage sensing) and/or to thermocouples and/or other sensors disposed inside swappable battery module 120. Sensor wires 127 can extend to first end plate 150 for connecting to battery management system 128 and/or forming one or more external connections.

In some examples, swappable battery module 120 comprises handle 178, e.g., for carrying swappable battery module 120 between electric vehicle 100 and external charger 180. Handle 178 is coupled (e.g., glued) to tubular enclosure 170 or, more specifically, interconnecting portion 173, e.g., as shown in FIG. 2G. In other examples, handle 178 is coupled (e.g., glued) to the side of tubular enclosure 170, which is opposite of interconnecting portion 173/gas-ventilation channel 177. More specifically, handle 178 is coupled to the side of tubular enclosure 170 adjacent to second surfaces 132 of battery cells 130. In these examples, when swappable battery module 120 is not fluidically coupled to either electric vehicle 100 or external charger 180, the residual thermal fluid 105 still occupies first fluid channel 121 and second fluid channel 122 thereby helping to maintain bus bars 140 inside this residual thermal fluid 105 (e.g., additional thermal mass and/or thermal conductivity to other pack components provided this by residual thermal fluid 105). It should be noted that the installation orientation (relative to the gravitational direction) of swappable battery module 120 on electric vehicle 100 and external charger 180 is such that handle 178 faces up while the residual thermal fluid 105 will be at the bottom of swappable battery module 120. It should also be noted that swappable battery module 120 can also be used under some operating conditions (e.g., low currents) without being fluidically coupled and without circulating thermal fluid 105 inside swappable battery module 120. In these examples, the residual thermal fluid 105 still assists with the heat dissipation with swappable battery module 120. In some examples, another handle can be attached to second end plate 160 and is used during the installation of swappable battery module 120 on electric vehicle 100 and external charger 180.

Figure 2J:
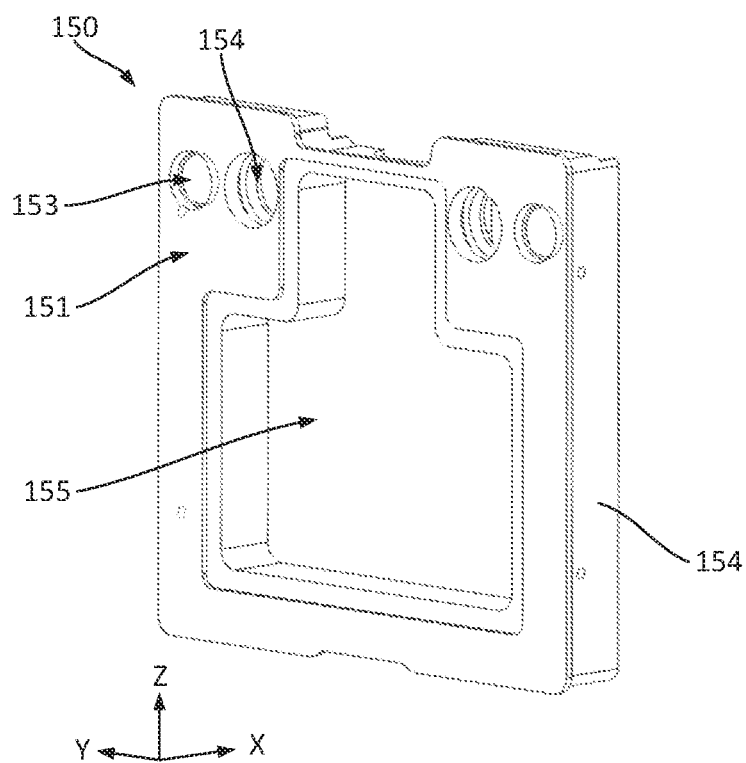
FIGS. 2J and 2K are schematic perspective front and back views of a first end plate, in accordance with some examples.
Figure 2K:
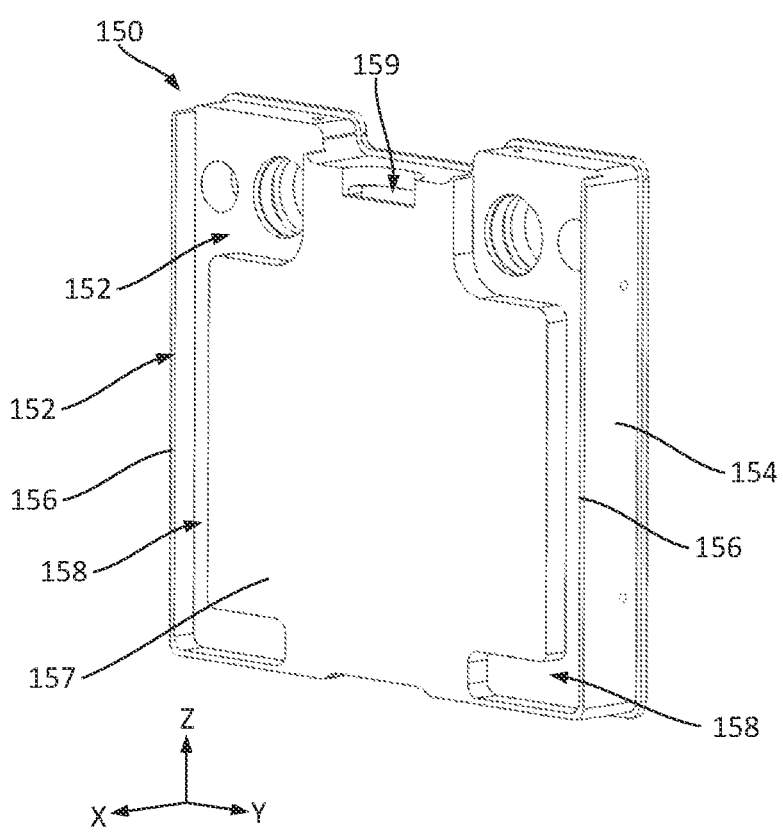

Referring to FIGS. 2J and 2K, in some examples, first end plate 150 comprises two electrical-terminal openings 153 (for installing first electrical terminal 241 and second electrical terminal 242—not shown in FIGS. 2J and 2K) and two fluid-port openings 154 (for installing first fluidic port 251 and second fluidic port 252—not shown in FIGS. 2J and 2K). Ins some examples, first fluidic port 251 and second fluidic port 252 are positioned further away from the side edges of first end plate 150 than corresponding first electrical terminal 241 and second electrical terminal 242. Alternatively, first fluidic port 251 and second fluidic port 252 are positioned closer to the side edges of first end plate 150 than the corresponding first electrical terminal 241 and second electrical terminal 242.

In some examples, the first end plate 150 comprises center protrusion 157 and two side edges 156. In swappable battery module 120 side edges 156 extend alongside surfaces 133 of first-end cell 137. Referring to FIG. 2K, two side edges 156 and center protrusion 157 from edge channels 158 fluidically coupling first fluid channel 121 and third fluid channel 125 and, separately, fluidically coupling second fluid channel 122 and fourth fluid channel 126.

Referring to FIG. 2J, in some examples, first end plate 150 comprises outer cavity 155 such that battery management system 128 is positioned with outer cavity 155 (e.g., as shown in FIG. 2B).

First end plate 150 also comprises passthrough 159 such that sensor wires 127 protrude through passthrough 159 and are sealed within passthrough 159.

In some examples, first end plate 150 comprises side edges 156 extending between first-end-plate outer surface 151 and first-end-plate inner surface 152. At least a portion of these side edges 156 can extend into and can be attached (e.g., glued and sealed) to tubular enclosure 170. In some examples, fasteners are used for connecting first end plate 150 tubular enclosure 170. In some examples, first end plate 150 is also glued to first-end cell 137.

Figure 2L:
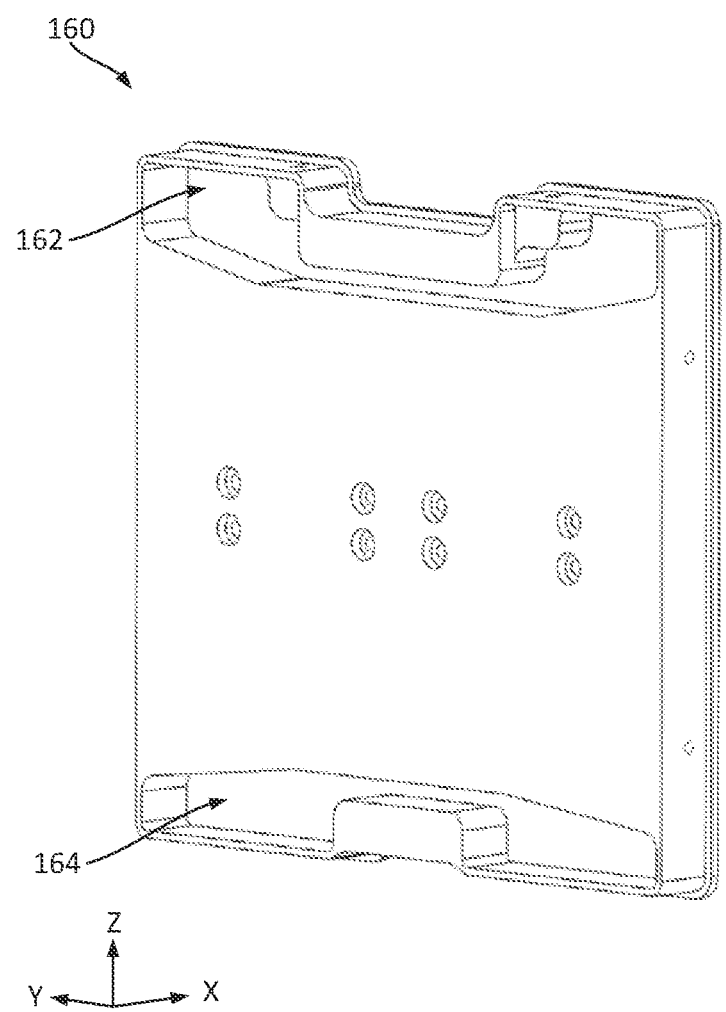
FIG. 2L is a schematic perspective view of a second end plate, in accordance with some examples.

Referring to FIG. 2L, in some examples, second end plate 160 comprises first cavity 162 fluidically coupling first fluid channel 121 and second fluid channel 122. Second cavity 164 fluidically couples third fluid channel 125 and fourth fluid channel 126. In battery assembly, second end plate 160 is attached to tubular enclosure 170, fluidically interconnecting first fluid channel 121 and third fluid channel 125, and fluidically interconnecting second fluid channel 122 and fourth fluid channel 126. For example, a portion of second end plate 160 protrudes into and is glued to tubular enclosure 170. In some examples, second end plate 160 is also glued to second-end cell 139.

Figure 3A:
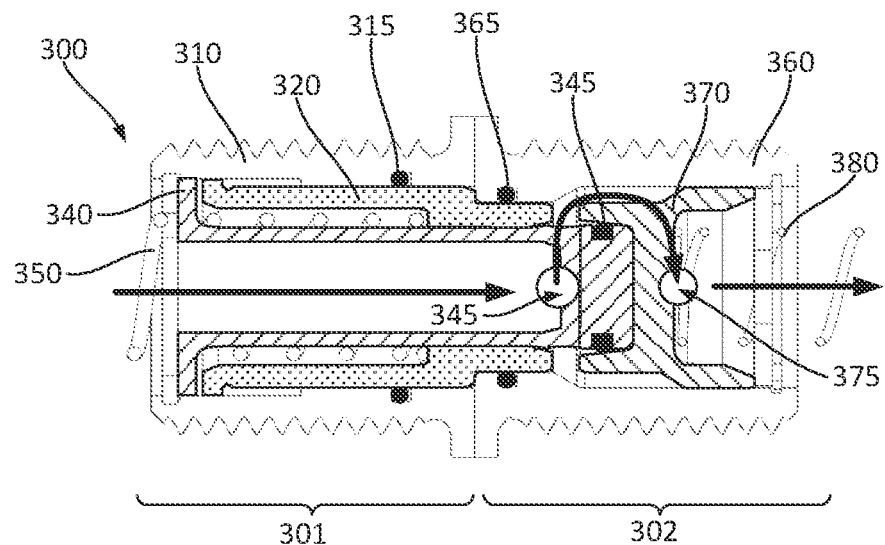
FIGS. 3A and 3B are schematic cross-sectional side views of a fluidic coupling comprising a first component and a second component, one of which can be operable as a fluidic port of a swappable battery module, in a coupled state (FIG. 3A) and a decoupled state (FIG. 3B) in accordance with some examples.
Figure 3B:
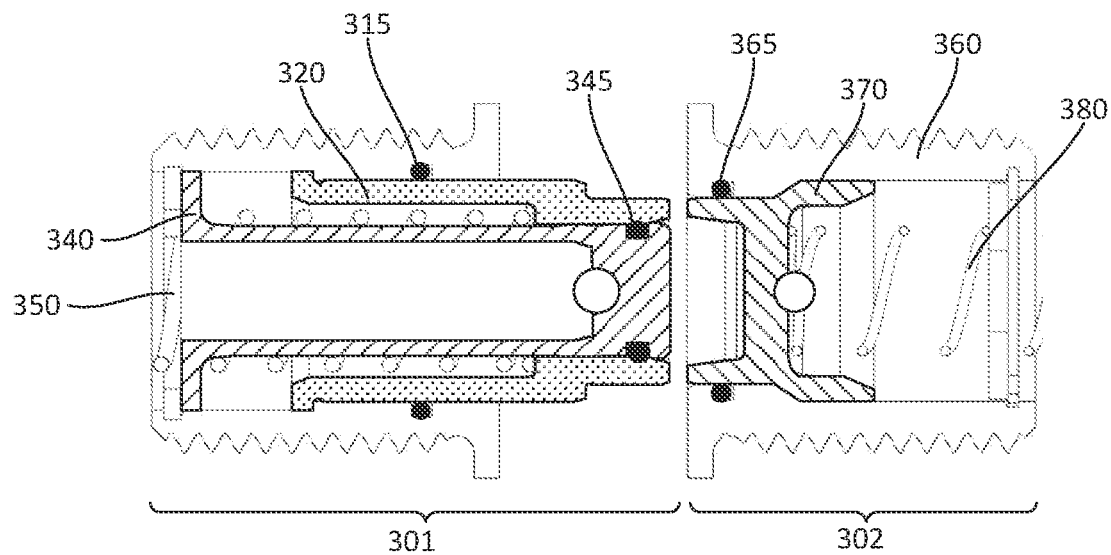

In some examples, each of first fluidic port 251 and second fluidic port 251 is configured to form fluidic coupling 300 with a corresponding fluidic port on one or both of electrical vehicle 100 and external charger 180. One example of fluidic coupling 300 is shown in FIGS. 3A and 3B. Specifically, fluidic coupling 300 comprises first component 301 and second component 302, configured to form a sealed fluidically coupling with each other in a coupled state (FIG. 3A) and to disconnect from each other while transitioning into a decoupled state (FIG. 3B). Either first component 301 or second component 302 can be operable as each of first fluidic port 251 and second fluidic port 251. When first component 301 is used as a fluidic port of swappable battery module, second component 302 is used to electric vehicle 100 and/or external charger 180. Alternatively, when second component 302 is used as a fluidic port of swappable battery module 120, first component 301 is used to electric vehicle 100 and/or external charger 180. It should be noted that second component 302 has a lower profile (no protrusions beyond its main body) thereby making second component 302 more suitable as a fluidic port of swappable battery module 120

Referring to FIGS. 3A and 3B, first component 301 comprises first body 310, first spool 320, first seal 315, slider 340, first slider seal 345, and first spring 350. First spool 320 is slidably coupled to first body 310 and also to slider 340. First spool 320 is also biased, relative to first body 310, by first spring 350 (e.g., in the direction of second component 302). First spool 320 is sealed against first body 360 by second seal 365, which allows first spool 320 to slide relative to first body 360.

Second component 302 comprises second body 360, second seal 365, second spool 370, and second spring 380. Second spool 370 is slidably coupled to and biased, by second spring 380, relative to second body 360. Specifically, second spool 370 is biased in the direction of first component 301.

When fluidic coupling 300 is in the coupled state, e.g., as shown in FIG. 3A, first spool 320 extends into second body 360 and is sealed against second body 360 by second seal 365. At the same time, first spool 320 is sufficient retracted into first body 310 allowing slider 340 to extend past first spool 320 and into second body 360. Slider 340 comprises slider opening 375 which allows thermal fluid 105 to flow from between the cavity inside slider 340 and the space between slider 340 and second body 360. Thermal fluid 105 can also flow through second-spool opening 375 between this space and the cavity of second spool 370. In other words, in this state, a fluidic pathway is provided between the cavity inside slider 340 and the cavity of second spool 370 thereby allowing the flow of thermal fluid 105 through fluidic coupling 300. At the same time, first spool 320 remains sealed against first body 310 by first seal 315 and also against second body 360 by second seal 365 thereby sealing the interface between first body 310 and second body 360.

When fluidic coupling 300 is in the decoupled state, e.g., as shown in FIG. 3B, first spool 320 is sealed relative to slider 340 by first slider seal 345 thereby blocking the flow of thermal fluid 105 from first component 301. First spool 320 remains sealed against first body 310 by first seal 315. Furthermore, second spool 370 is sealed relative to second body 360 by second seal 365 thereby blocking the flow of thermal fluid 105 from second component 302. The transition between the coupled state and decoupled state is described below with reference to FIG. 4 and FIGS. 5A-5F below.

Examples of Methods of Operating Swappable Battery Modules

Figure 4:
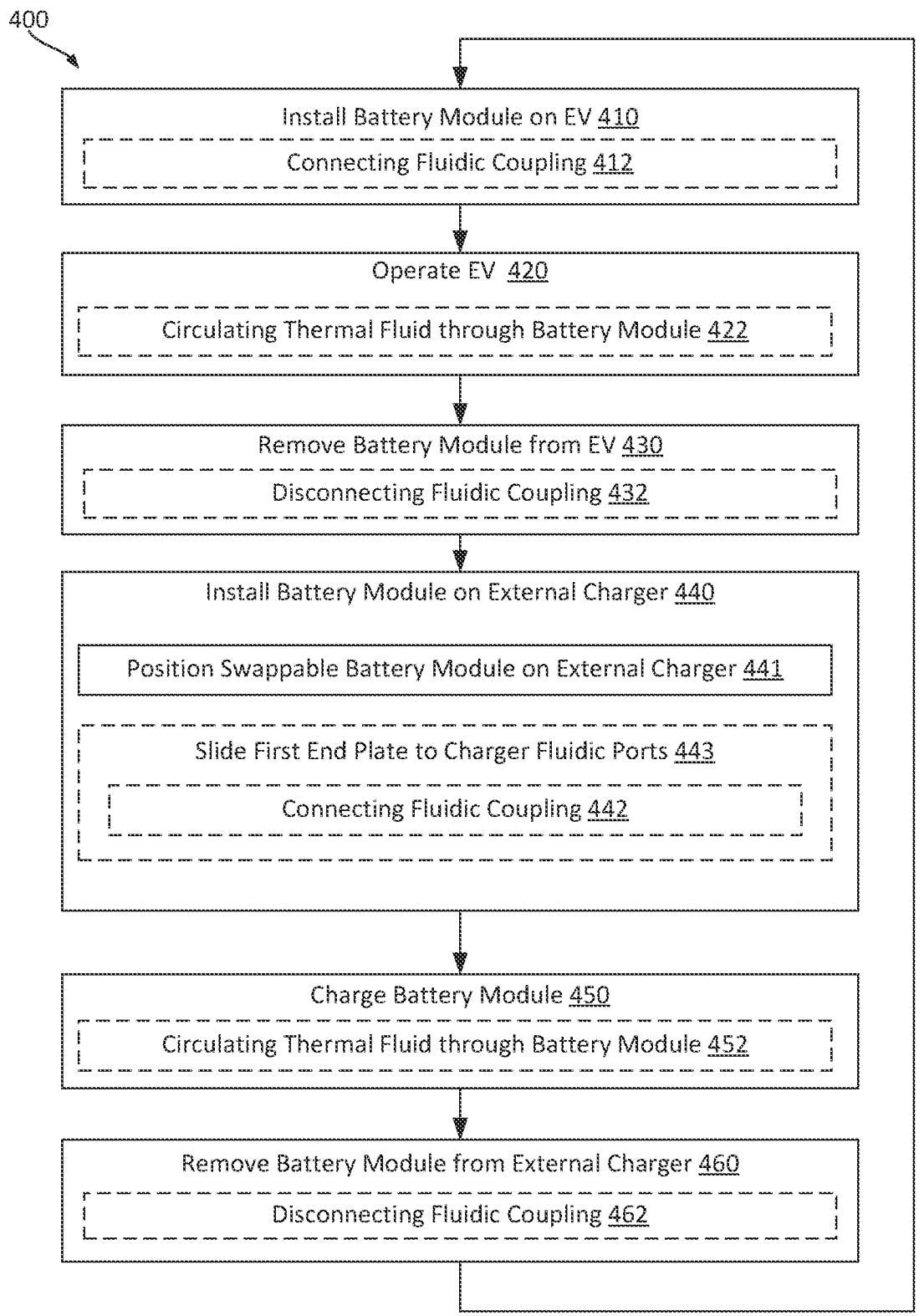
FIG. 4 is a process flowchart of a method for operating a swappable battery module, in accordance with some examples.

FIG. 4 is a process flowchart corresponding to method 400 of operating swappable battery module 120, in accordance with some examples. Method 400 may commence with (block 410) installing swappable battery module 120 on electric vehicle 100. For example, electric vehicle 100 can include a bay for receiving swappable battery module 120.

During this installation operation, swappable battery module 120 forms an electrical connection with electric vehicle 100 using first electrical terminal 241 and second electrical terminal 242. For example, electric vehicle 100 can include corresponding terminals configured to connect with the first electrical terminal 241 and second electrical terminal 242. In some examples, swappable battery module 120 forms a mechanical connection with electric vehicle 100 (e.g., locked using a latching mechanism). Furthermore, in some examples, installing swappable battery module 120 on electric vehicle 100 comprises (block 412) forming a fluidic coupling between swappable battery module 120 and electric vehicle 100, e.g., using first fluidic port 251 and second fluidic port 252 of swappable battery module 120. One example of such coupling is shown and described above with reference to FIGS. 3A and 3B. Additional features are described below with reference to FIGS. 5A-5F below. This fluidic coupling is optional, and, in some examples, swappable battery module 120 is not fluidically connected to electric vehicle 100.

Method 400 may proceed with (block 420) operating electric vehicle 100, e.g., by powering electric vehicle 100 from swappable battery module 120. As a result, swappable battery module 120 is discharged during this operation. It should be noted that, in some examples, swappable battery module 120 may be also charged onboard electric vehicle 100. In some examples (when swappable battery module 120 is fluidically connected to electric vehicle 100), operating electric vehicle 100 may comprise (block 422) circulating thermal fluid 105 through swappable battery module 120. For example, electric vehicle 100 may include vehicle thermal management system 110, which is designed to condition the temperature of thermal fluid 105 (e.g., by heating and/or cooling thermal fluid 105) and to pump thermal fluid 105 through swappable battery module 120. In some examples, swappable battery module 120 and electric vehicle 100 can be communicatively coupled during this operation. For example, swappable battery module 120 can measure the internal cell temperature and send this information to vehicle thermal management system 110.

Method 400 may proceed with (block 430) removing battery module 120 from electric vehicle 100. This operation may be the reverse of the installation operation (block 410) described above. During the module removal operation, the electrical connection between swappable battery module 120 and electric vehicle 100 is separated (e.g., by disconnecting first electrical terminal 241 and second electrical terminal 242 from the corresponding terminals on electric vehicle 100). In some examples (when swappable battery module 120 is fluidically connected to electric vehicle 100), the battery removal operation (block 430) also comprises (block 432) disconnecting the fluidic coupling between swappable battery module 120 and electric vehicle 100 as will now be described with reference to FIGS. 5A-5F.

Figure 5A:
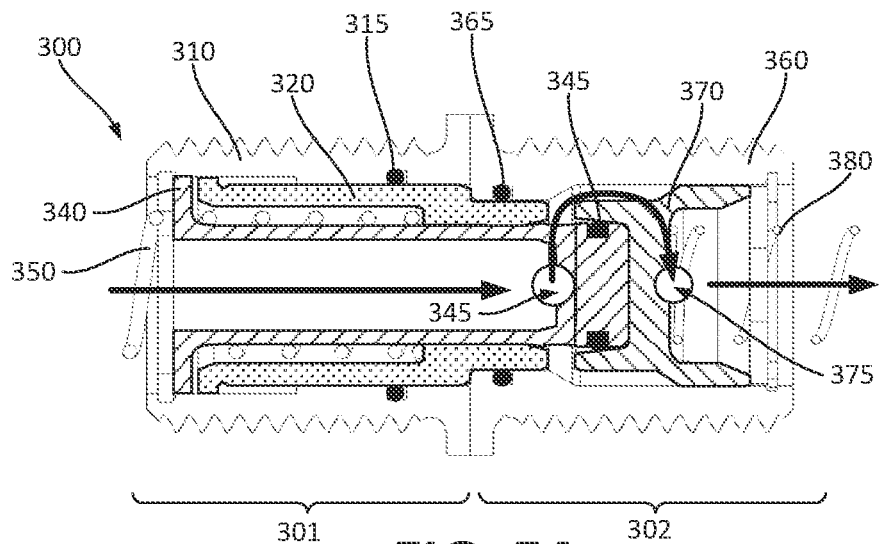
FIGS. 5A-5F are schematic cross-sectional side views of a fluidic coupling at different stages while decoupling the first component from the second component, in accordance with some examples.
Figure 5B:
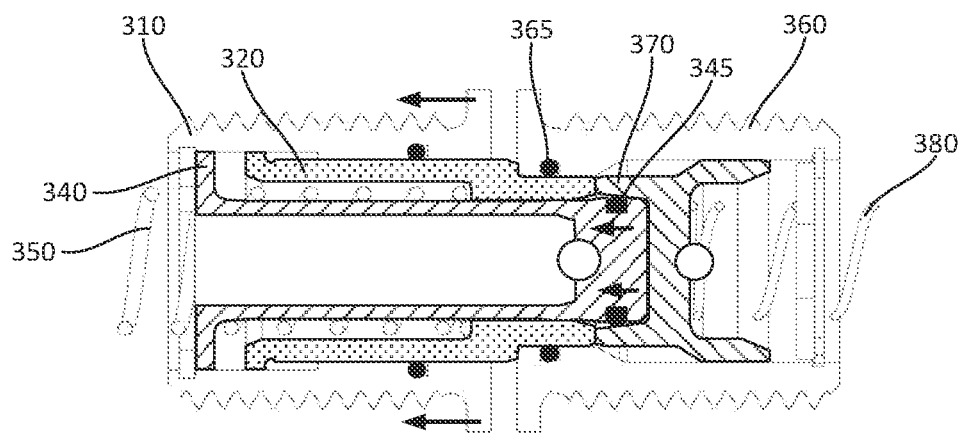

Specifically, FIG. 5A illustrates fluidic coupling 300 is in the coupled state, which is described above with reference to FIG. 3A. FIG. 5B illustrates the first step in this disconnecting operation where first body 310 is moved away from second body 360. First spool 320 is biased by first spring 350, which pushes first spool 320 out of first body 310. At this step, the second body 360 is operable as a positive stop for first spool 320. In fact, the second body 360 is operable as a positive stop for first spool 320 during the coupled state in FIG. 5A and the next/second step in FIG. 5C. Referring to FIG. 5B, slider 340 follows first body 310 and is retracted into first spool 320. At this step, first slider seal 345 is not contacting/sealed against first spool 320 thereby allowing thermal fluid 105 to flow (through second-spool opening 375) between the cavity inside slider 340 and the space between slider 340 and second body 360. At the same time, as slider 340 follows first body 310 and is retracted into first spool 320, second spool 370 is biased toward first spool 320. FIG. 5B illustrates a point where second spool 370 reaches and contacts first spool 320. From this point on, first spool 320 is operable as a positive stop for second spool 370, at least through the few steps described below. In the coupled state of FIG. 5A, slider 340 acted as a positive stop for second spool 370. This spool contact can restrict the flow of thermal fluid 105 (in comparison to the coupled state of FIG. 5A) but does not fully seal the flow.

Figure 5C:
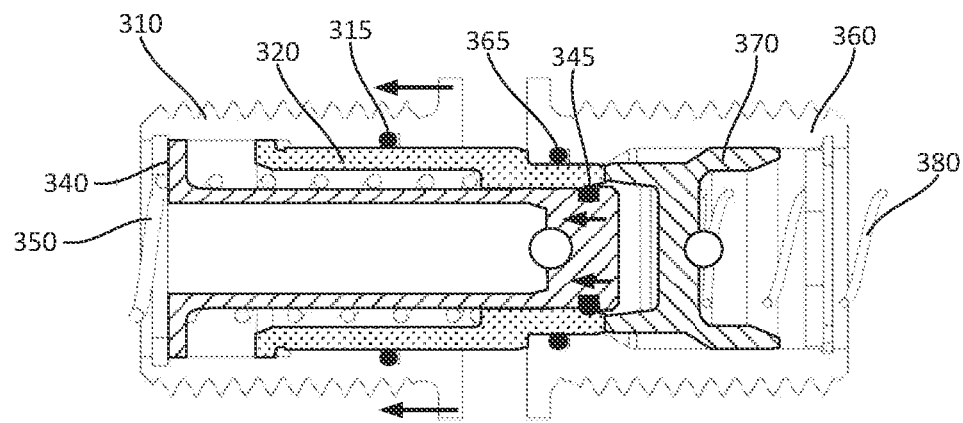

FIG. 5C illustrates the second step in this disconnecting operation where first body 310 is moved further away from second body 360 (in comparison to the first step of FIG. 5B). Slider 340 follows first body 310 and is retracted into first spool 320. However, at this step, first slider seal 345 is sealed against first spool 320 thereby preventing thermal fluid 105 to flow between the cavity inside slider 340 and the space between slider 340 and second body 360. First spool 320 continues being pushed out of first body 310 by first spring 350 with second body 360 still operable as a positive stop.

Figure 5D:
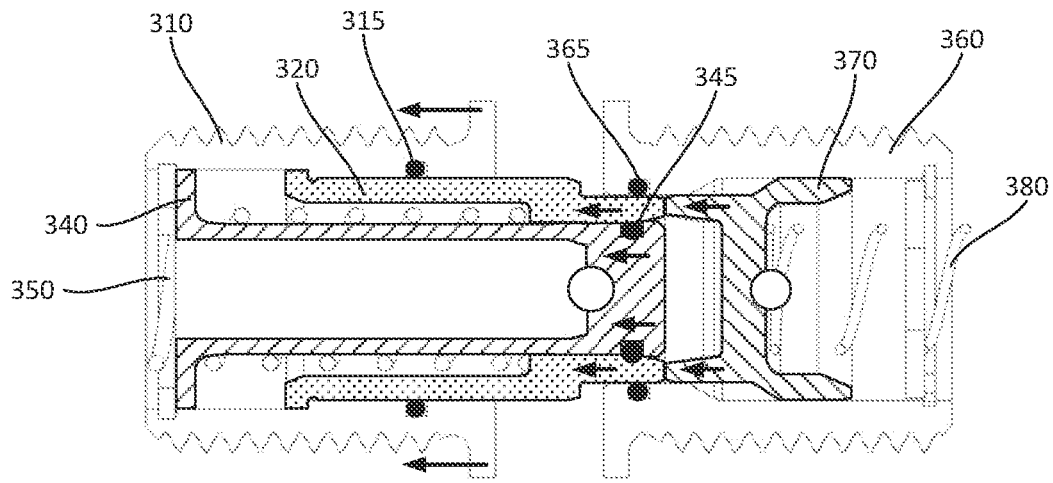

FIG. 5D illustrates the third step in this disconnecting operation where first body 310 is moved further away from second body 360 (in comparison to the second step of FIG. 5C). First slider seal 345 remains sealed against first spool 320 thereby preventing the flow of thermal fluid 105. First spool 320 is no longer being pushed out of first body 310 since a feature of first body 310 is now operable as a positive stop for first spool 320. As such, first spool 320 is now being extracted from second body 360. However, second seal 365 still seals against first spool 320 at this stage.

Figure 5E:
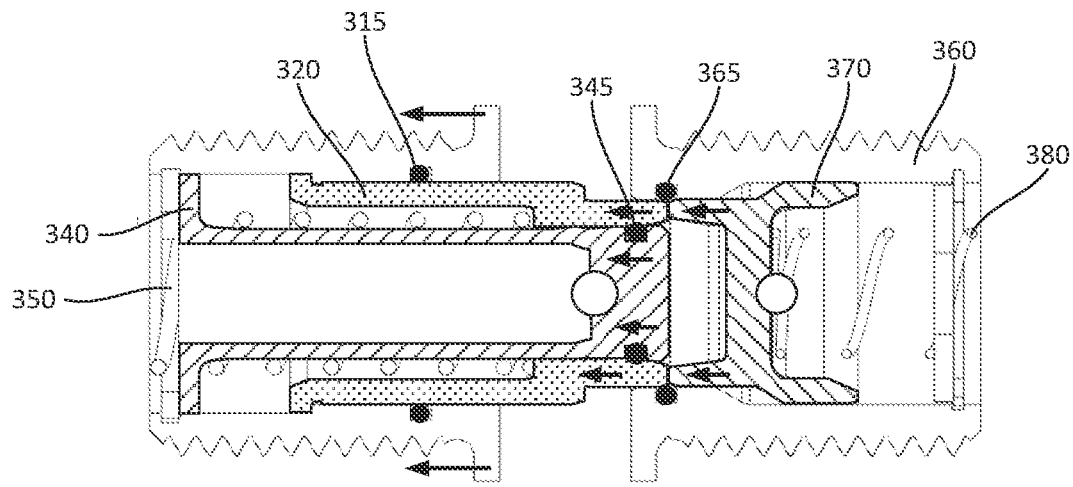

FIG. 5E illustrates the fourth step in this disconnecting operation where first body 310 is moved further away from second body 360 (in comparison to the second step of FIG. 5D). First slider seal 345 remains sealed against first spool 320 thereby preventing the flow of thermal fluid 105. First spool 320 continues being extracted from second body 360. The specific point (shown in FIG. 5E) can be referred to as the "second seal handoff" where second seal 365 disengages first spool 320 and engages second spool 370, which follows the travel of first spool 320.

Figure 5F:
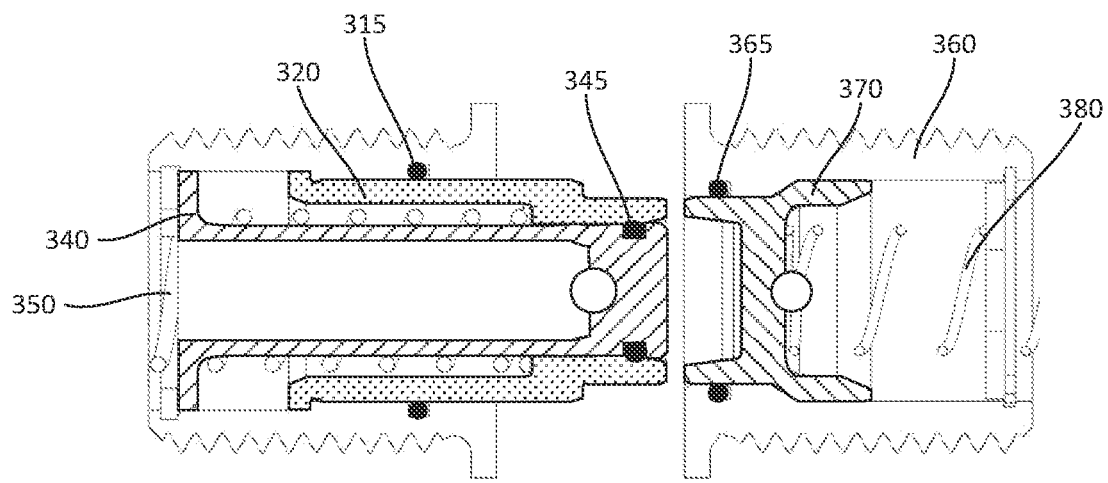

Finally, FIG. 5F illustrates the decoupled state where first body 310 is moved even further away from second body 360 (in comparison to the second step of FIG. 5E). This decoupled state is described above with reference to FIG. 3B.

Returning to FIG. 4, method 400 may proceed with (block 440) installing swappable battery module 120 on external charger 180. For example, this installation operation may comprise (block 441) positioning swappable battery module 120 on external charger 180 comprising charger fluidic ports 183. One example of external charger 180 is shown in FIGS. 6A-6E. It should be noted that a module connection on electric vehicle 100 may be configured in a similar manner and include the same components.

Figure 6A:
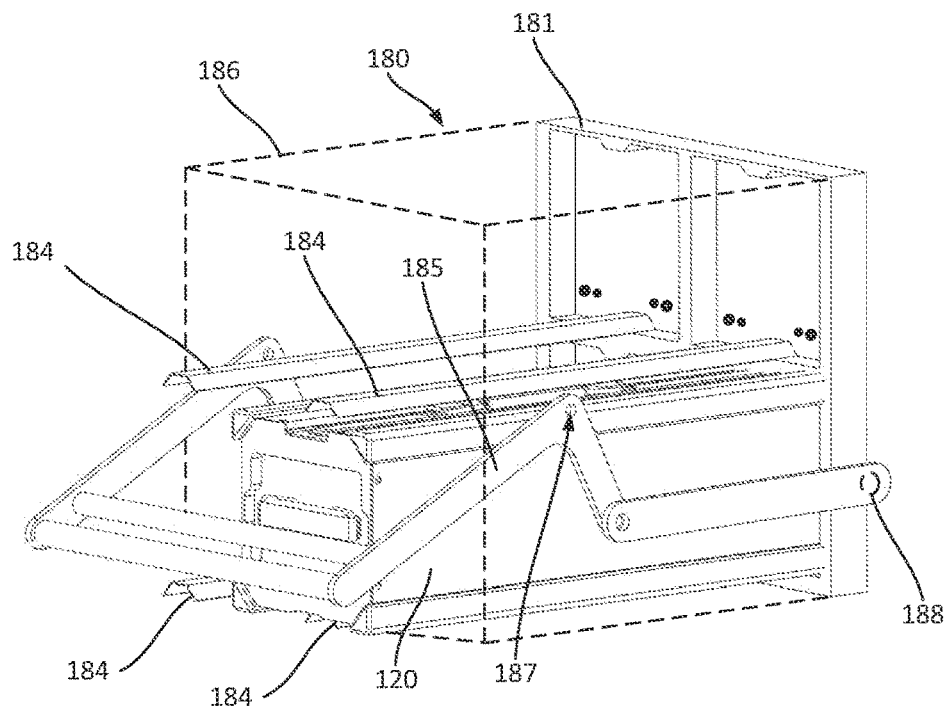
FIGS. 6A and 6B are schematic views of an external charger and one swappable battery module connected to the charger, in accordance with some examples.
Figure 6B:
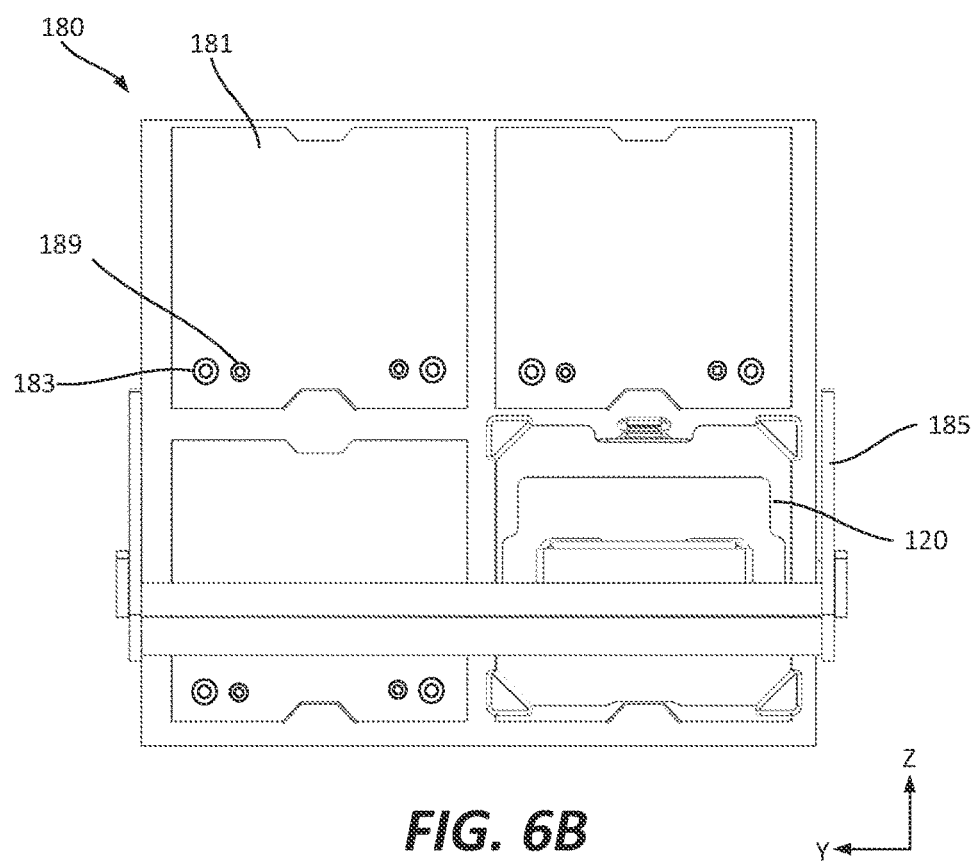

FIGS. 6A and 6B illustrate external charger 180 suitable for connecting to four swappable battery modules 120. However, only one swappable battery module 120 is shown in these views. External charger 180 comprises charger base 181, providing four module bays (one for each swappable battery module 120). Each module bay comprises module support rail 184, two charger fluid ports 183, and two charger electric terminals 189. Module support rail 184 is configured to support swappable battery module 120 and allow swappable battery module 120 to slide in and out of the module bay while forming electric and fluid connections with external charger 180. Two charger fluid ports 183 are aligned (e.g., concentrically aligned) with corresponding fluid ports 250 of swappable battery module 120 while swappable battery module 120 is positioned on module support rail 184.

Each module bay also comprises limiting arm 185 pivotably coupled (at pivot point 187) to charger enclosure 186. Limiting arm 185 comprises limiting bar 188 positioned on the arm end proximate to charger base 181. Pivoting the limiting arm 185 changes the distance between limiting bar 188 and charger base 181 as will now be described with reference to reference to FIGS. 6C-6E.

Method 400 may proceed with (block 443) sliding first end plate 150 of swappable battery module 120 toward charger fluidic ports 183 until charger fluidic ports 183 are fluidically coupled with first fluidic port 251 and second fluidic port 252. In other words, this sliding operation also comprises (block 442) connecting the fluidic coupling or, more specifically, connecting fludic ports 250 of swappable battery module with charger fluidic ports 183.

Figure 6C:
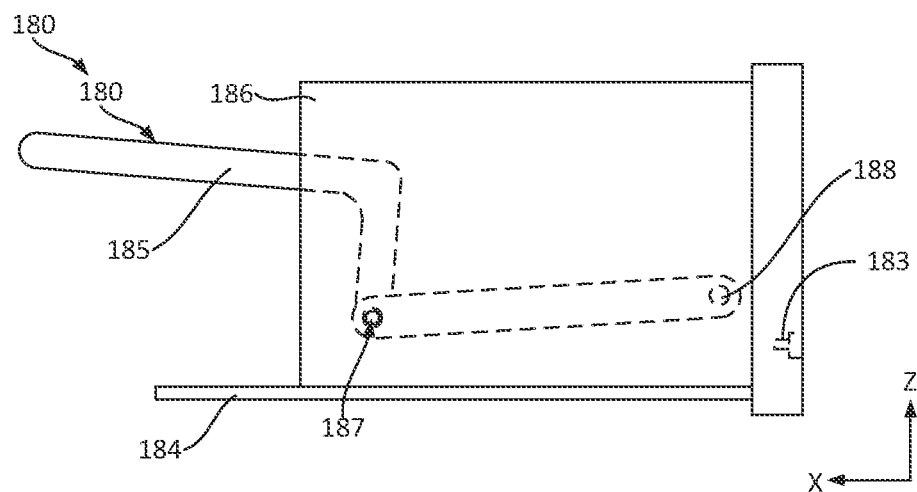
FIGS. 6C-6E are schematic side views of an external charger at various stages while connecting a swappable battery module to the charger, in accordance with some examples.
Figure 6D:
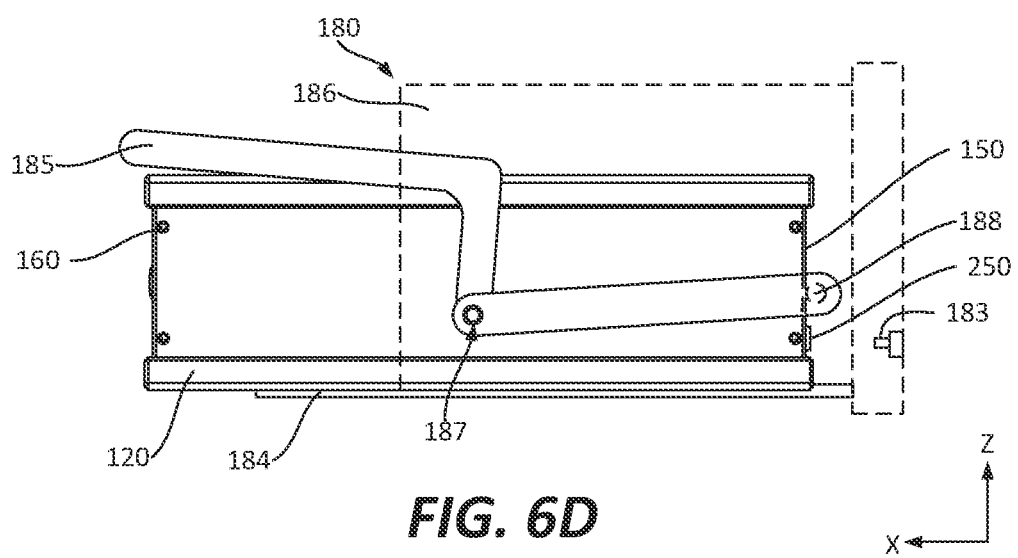

FIG. 6C is a schematic side view of external charger 180 without swappable battery module 120, in which limiting arm 185/limiting bar 188 is in the first position (further away from charger base 181). As swappable battery module 120 slides on support rail 184 toward charger base 181, swappable battery module 120 first contacts limiting bar 188 (e.g., as shown in FIG. 6D) that prevents swappable battery module 120 from hitting charger base 181 and, more specifically, prevents corresponding fluid ports 250 of swappable battery module 120 from hitting charger fluid ports 183 and, also, corresponding electric terminals 240 of swappable battery module 120 from hitting charger electric terminals 189. It should be noted that swappable battery module 120 is quite heavy and can carry significant momentum while sliding on support rail 184. It should be also noted that limiting bar 188 is positioned such that neither fluid ports 250 nor electric terminals 240 contact limiting bar 188 during this stage.

Figure 6E:
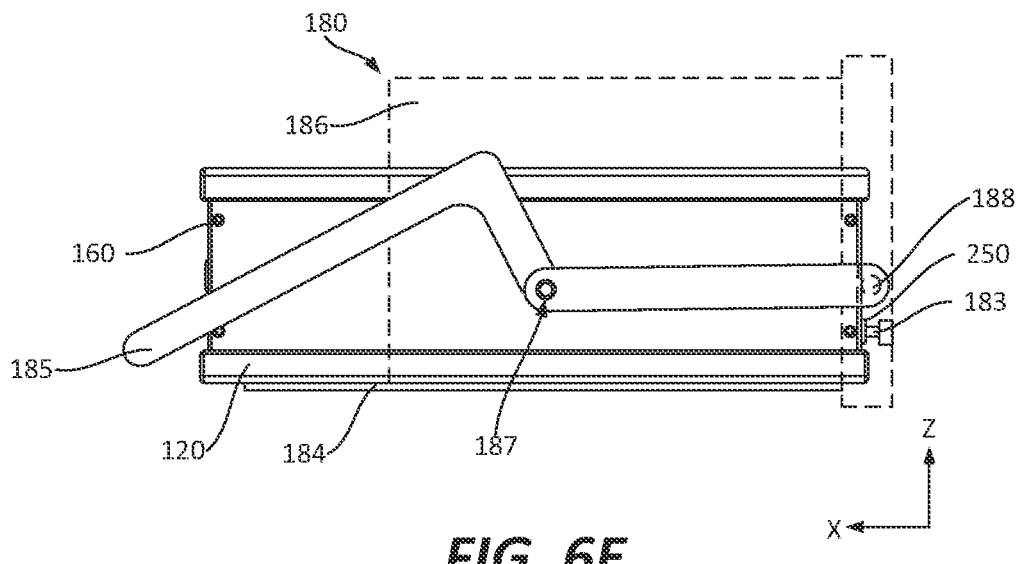

FIG. 6E is a schematic side view of external charger 180 with limiting arm 185/limiting bar 188 being in the position (closer to charger base 181). As limiting bar 188 transitions from the first position (in FIG. 6D) to the second position (in FIG. 6E), swappable battery module 120 is allowed to get closer to charger base 181 and form the electric and fluidic coupling with external charger 180.

Method 400 may proceed with (block 450) charging swappable battery module 120 on external charger 180. As a result, swappable battery module 120 is charged during this operation. In some examples (when swappable battery module 120 is fluidically connected to external charger 180), this charging operation may comprise (block 452) circulating thermal fluid 105 through swappable battery module 120. For example, external charger 180 may include charger thermal management system 190, which is designed to condition the temperature of thermal fluid 105 (e.g., by heating and/or cooling thermal fluid 105) and to pump thermal fluid 105 through swappable battery module 120. In some examples, swappable battery module 120 and external charger 180 can be communicatively coupled during this operation. For example, swappable battery module 120 can measure the internal cell temperature and send this information to charger thermal management system 190.

Figure 7A:
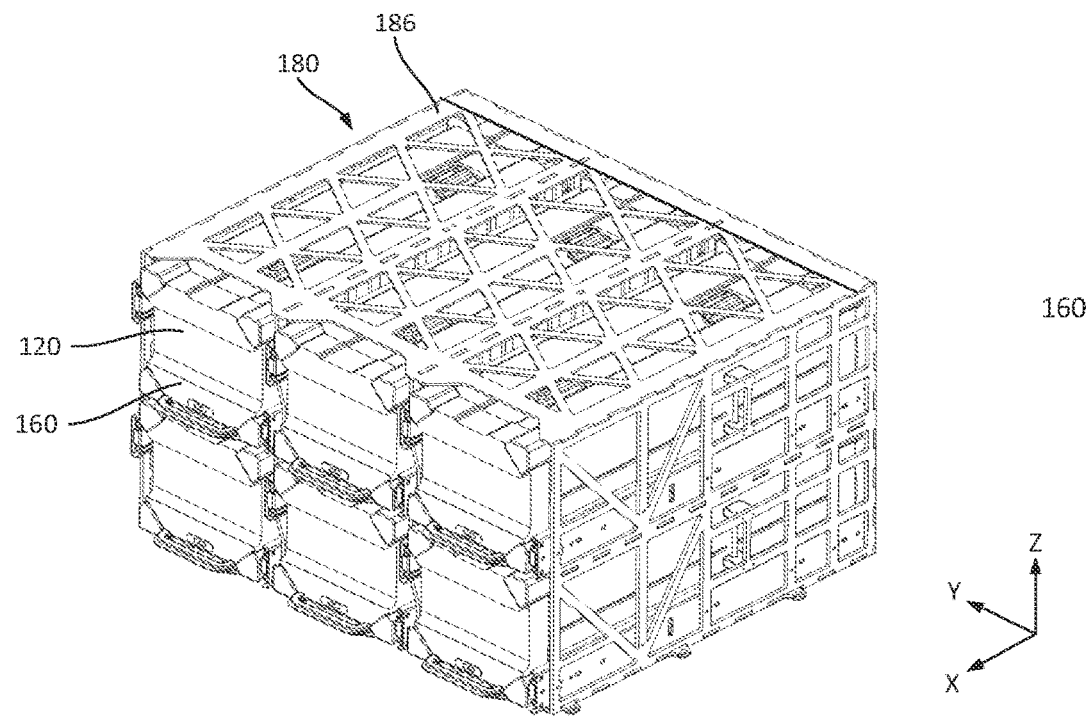
FIGS. 7A-7C are schematic side views of an external charger supporting six swappable battery modules, in accordance with some examples.
Figure 7B:
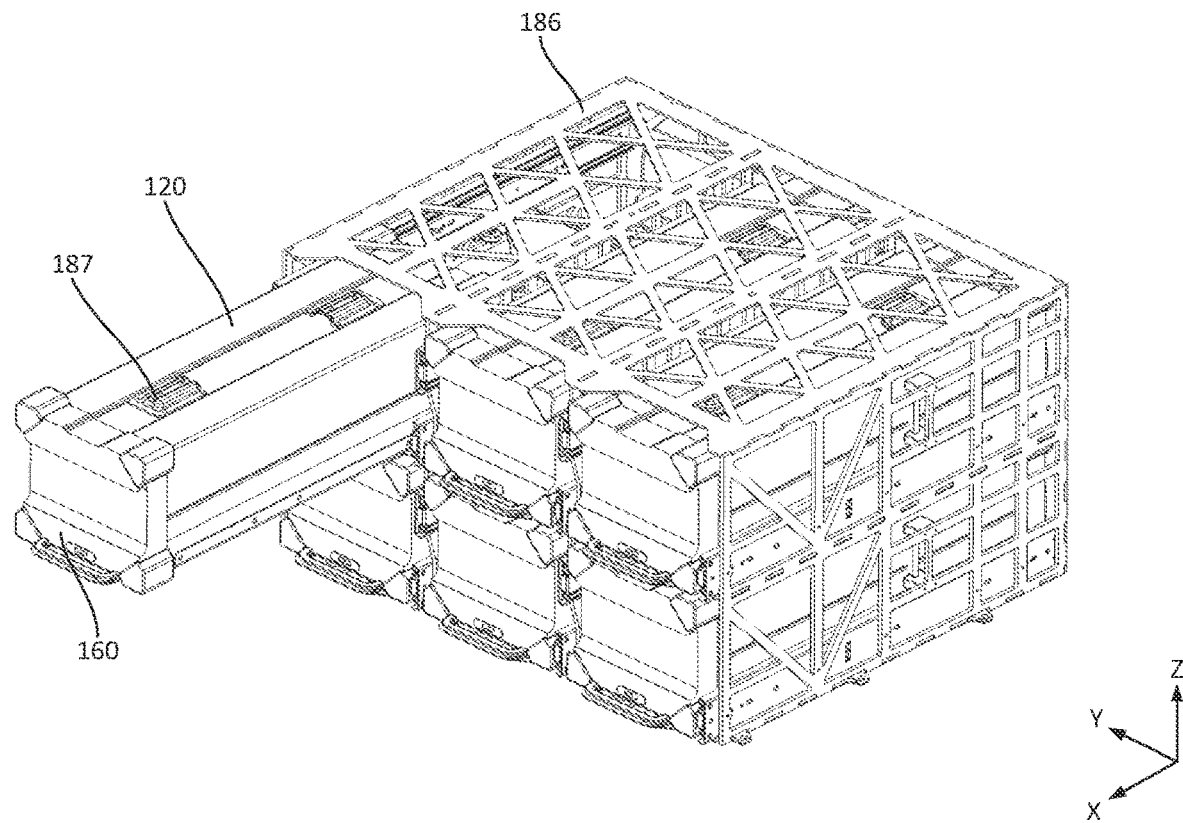
Figure 7C:
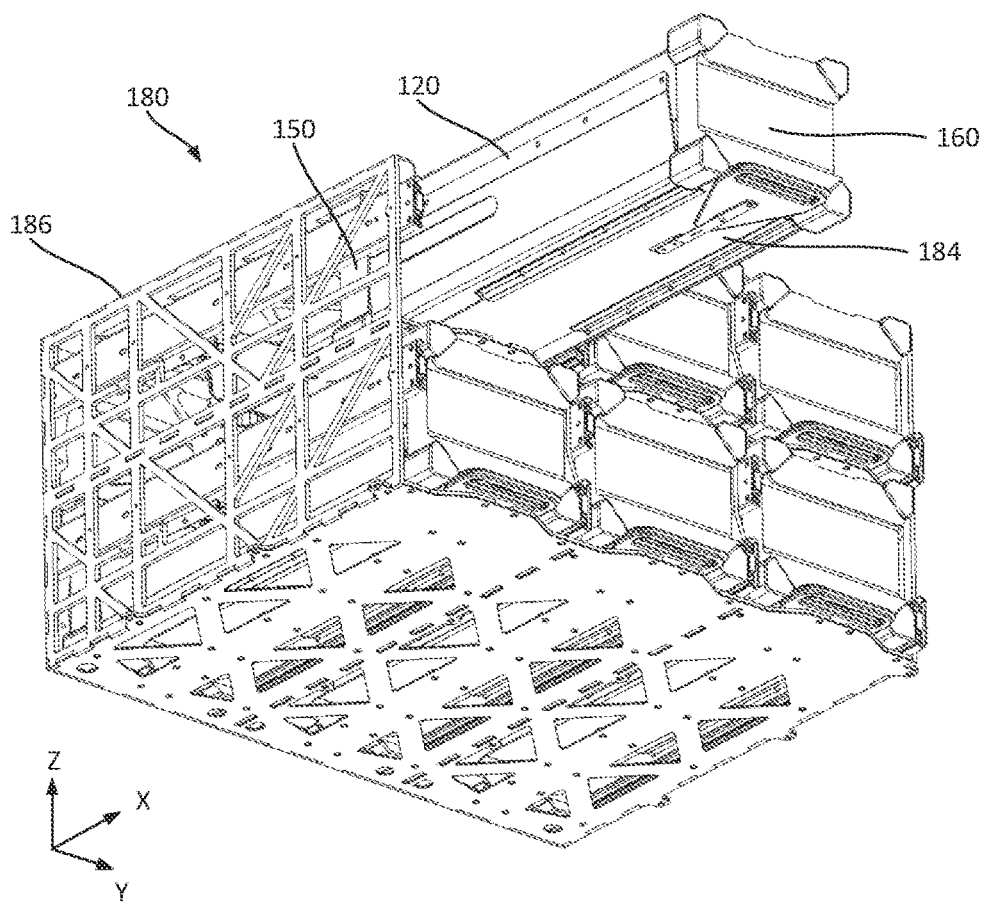

FIGS. 7A-7C illustrate another example of the external charger 180 with six swappable battery modules 120 positioned in this external charger 180, e.g., one in each module slot. The external charger 180 example (shown in FIGS. 7A and 7B) includes six module slots integrated into the same enclosure 186, while the example in FIGS. 6A and 6B includes four module slots. The number of module slots determines the maximum number of swappable battery module 120 that can be charged in the external charger 180 at the same time. It should be noted that fewer than the maximum number of swappable battery module 120 can be charged in the external charger 180 at the same time. It should be also noted that a structure similar to the external charger 180 maybe used on an electric vehicle 100, e.g., to discharge one or more swappable battery modules 120 during the operation of the electric vehicle 100.

Figure 7D:
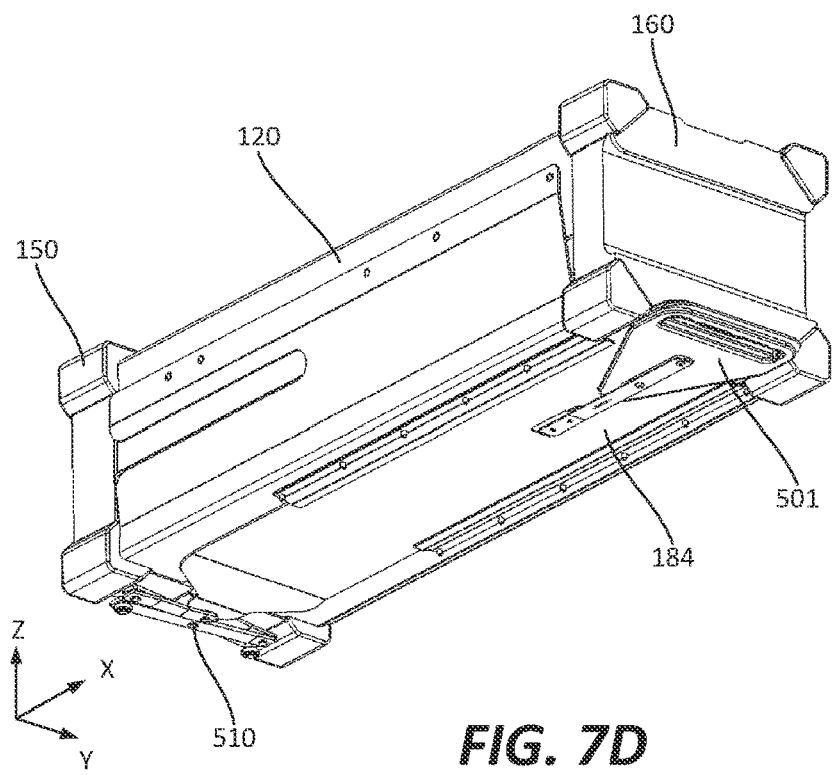
FIG. 7D is a bottom perspective view of a swappable battery module removed from the charger and attached to a module support rail, in accordance with some examples.

Similar to the example in FIGS. 6A and 6B, the external charger 180 in FIGS. 7A-7C comprises a module support rail 184 for supporting each swappable battery module 120, e.g., as shown in FIGS. 7C and 7D. However, the design of this module support rail 184 is different. Specifically, the design in FIGS. 7C and 7D allows the rail handle 501 to move at a higher speed than the swappable battery module 120, relative to the charger base 181 (from which the swappable battery module 120 is disconnected), during the initial removal stage of the swappable battery module 120 (e.g., while the charger fluidic ports 183 and two charger electric terminals 189 of the charger base 181 are being disconnected from the corresponding fluid ports 250 and corresponding electric terminals 240 on the swappable battery module 120). This speed difference is enabled by a lever-based unit 510 that controls the relative speed of the rail handle 501 and the swappable battery module 120. The speed difference allows for the use of a smaller force on the rail handle 501 than actually needed to disconnect these ports and terminals thereby reducing the strain on the operators. Furthermore, during the installation of the swappable battery module 120 to the external charger 180 or, more specifically, while the swappable battery module 120 is being inserted into a corresponding slot of the external charger 180, this speed difference helps to slowdown the swappable battery module 120 as the external charger 180 approaches the charger fluidic ports 183 and two charger electric terminals 189 of the charger base 181 thereby eliminating the significant impact in these ports and terminals. It should be noted that the swappable battery module 120 is relatively heavy. Various design features providing this speed/force difference will now be described with reference to FIGS. 8A, 8B, and 9A-9E.

Figure 8A:
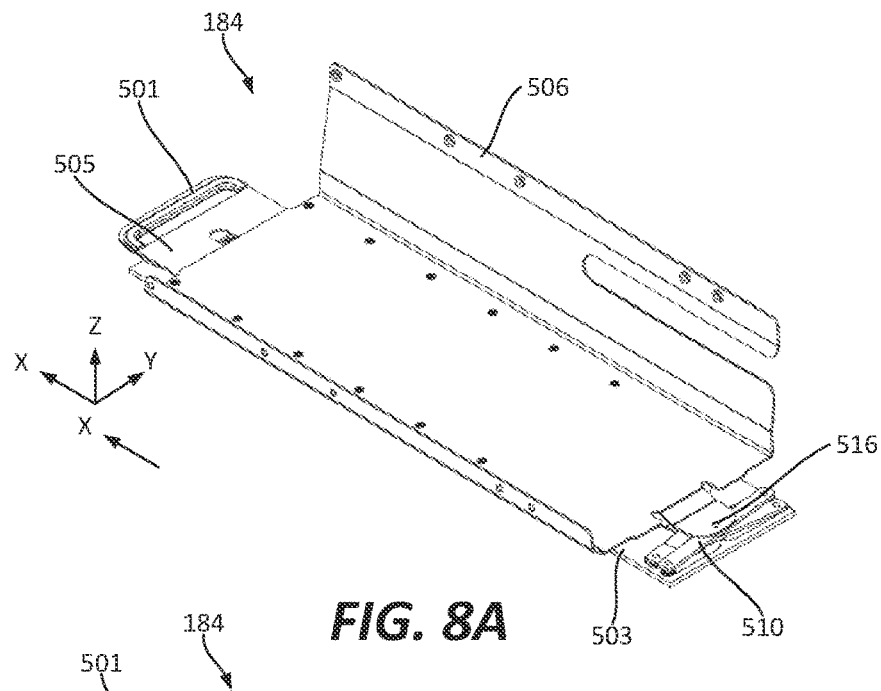
FIGS. 8A and 8B are two perspective views of a module support rail for supporting a swappable battery module in an external charger, in accordance with some examples.
Figure 8B:
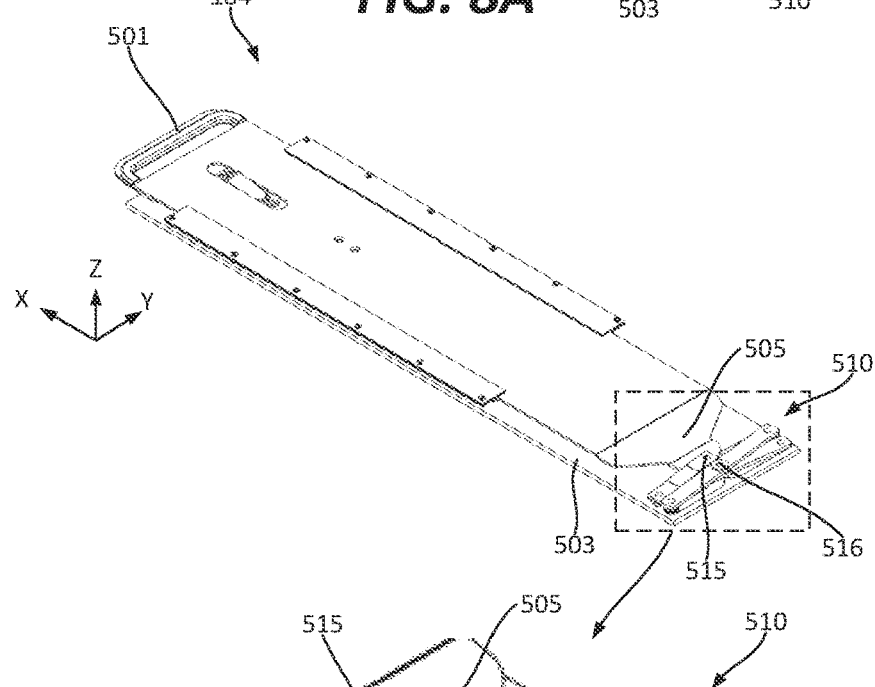
Figure 8B:
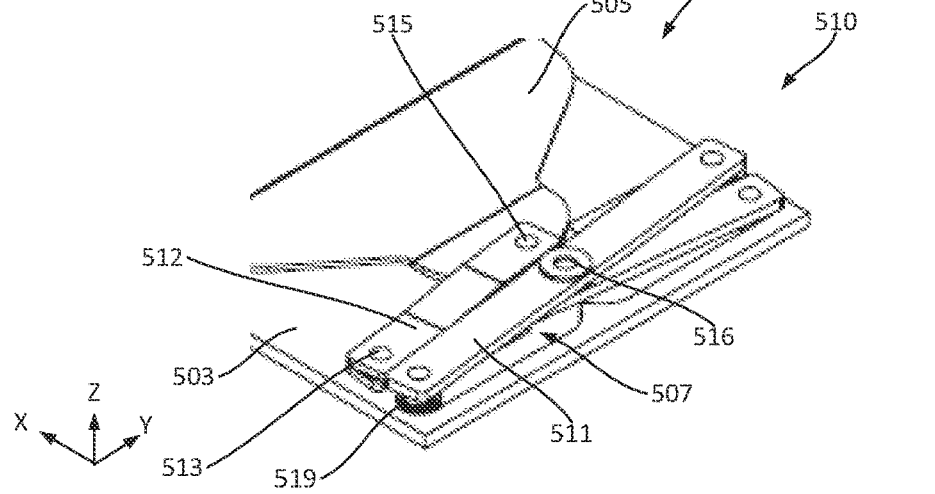

Referring to FIGS. 8A and 8B, the module support rail 184 comprises a rail base 503, a first slider 505, a second slider 506, and a lever-based unit 510. The rail base 503 is fixedly attached to enclosure 186 and does not move during the removal/installation of the swappable battery module 120. The first slider 505 comprises a rail handle 501 positioned on the end of the first slider 505 opposite the end attached to the lever-based unit 510. When an operator pulls the rail handle 501, the lever-based unit 510 is actuated as further described below. The second slider 506 is configured to house a swappable battery module 120 (the swappable battery module 120 is not shown in FIG. 8A) For example, the second slider 506 may include a quick disconnect for supporting the swappable battery module 120 relative to the second slider 506.

The lever-based unit 510 independently connects each of the first slider 505 and the second slider 506 to the rail base 503. However, the connection points are different, which provides the speed difference as will now be described with reference to FIG. 8B. Specifically, the lever-based unit 510 comprises two sets of levers, i.e., the first lever set 511 and the second lever set 512. The first end of the first lever set 511 is connected to bushings 519 that protrude into a rail-base slot 507 of the rail base 503. The mid-point of the first lever set 511 is used as a second-slider connection point 516. The second end of the first lever set 511 is pivotably coupled (at a pivot point 513) to the first end of the second lever set 512. Finally, the second end of the second lever set 512 is used as a first-slider connection point 515. Since the first-slider connection point 515 and the second-slider connection point 516 are positioned on the different lever sets, the speed with which these points move along the X-axis during at least the initial stages of the removal of the swappable battery module 120 is different as further described below with reference to FIGS. 9A-9E.

Overall, the first lever set 511 is connected to the bushings 519 at a first end, pivotably connected to the first slider 505 at a midpoint, and pivotably connected to the second lever set 512 at a second end of the first lever set 511, opposite to the first end. The second lever set 512 is pivotably connected to the first lever set 511 and the first slider 505 at opposite ends of the second lever set 512. When the bushings 519 slides within in the engagement slot section 508, an angle between the first lever set 511 and the second lever set 512 changes. When the bushings 519 slides within the extraction slot section 509, the angle between the first lever set 511 and the second lever set 512 is constant.

In some examples, when the bushings 519 is in the engagement slot section 508, the first slider 505 moves at least twice faster or even at least three times faster than the second slider 506. The speed difference depends on the geometry of the lever-based unit 510, e.g., lengths of different portions of the first lever set 511 and second lever set 512.

Overall, the external charger 180 comprises an enclosure 186 and a module support rail 184 slidably coupling the swappable battery module 120 and the enclosure 186. The module support rail 184 comprises a rail base 503, a first slider 505, a second slider 506, and a lever-based unit 510, interconnecting the rail base 503, the first slider 505, and the second slider 506. The rail base 503 is fixed to the enclosure 186. The second slider 506 is detachably coupled to the swappable battery module 120. The first slider 505 and the second slider 506 move at different speeds or at a same speed relative to the charger base 181 depending on proximity of the first end plate 150 to the charger base 181.

In some examples, the rail base 503 comprises a rail-base slot 507 defined by an engagement slot section 508 and an extraction slot section 509, extending perpendicular to the engagement slot section 508. The lever-based unit 510 comprises bushings 519 slidably fit into the rail-base slot 507. When the bushings 519 is in the engagement slot section 508, the first slider 505 moves faster than the second slider 506 (and the lever-based unit 510 is unlocked and can expand and contract). When the bushings 519 is in the extraction slot section 509, the first slider 505 and the second slider 506 move at the same speed (and the lever-based unit 510 is locked).

Referring to FIGS. 9A-9E, the rail-base slot 507 comprises two sections, i.e., an engagement slot section 508 and an extraction slot section 509, extending perpendicular to the engagement slot section 508. When the swappable battery module 120 is connected to or even proximate to the charger base 181, the bushings 519 of the lever-based unit 510 slide within the engagement slot section 508. Specifically, the two bushings 519 are either brought close to each other (when the swappable battery module 120 is moved away from the charger base 181) or pushed away from each other (when the swappable battery module 120 is brought closer to the charger base 181). In fact, the opposite ends of the engagement slot section 508 define the stop point of the swappable battery module 120 when the swappable battery module 120 is slid towards the charger base 181. In other words, the engagement slot section 508 comprises end points, operable as positive stops and define a closest position between the swappable battery module 120 and the charger base 181.

It should be noted that because of the "scissor-like" design of the lever-based unit 510 (with pivot points 513), both the second-slider connection point 516 and the first-slider connection point 515 are able to move along the extraction slot section 509 (along the X axis) while the bushings 519 are still within the extraction slot section 509, e.g., as schematically shown in FIGS. 9A-9C. However, the linear speed (along the extraction slot section 509/the X axis) is different for different points. In the example, where the distance between the first-slider connection point 515 and the pivot point 513 is the same as the distance between the pivot point 513 and the second-slider connection point 516 and also the same as the distance between the second-slider connection point 516 and the bushings 519, the linear speed (along the extraction slot section 509/the X axis) of the first-slider connection point 515 is three times greater than the linear speed of the second-slider connection point 516. It should be noted that the linear speed (along the extraction slot section 509/the X axis) of the bushings 519 is zero, at least until the two bushings 519 reach the extraction slot section 509. As such, the speed of the first slider 505 (attached to the first-slider connection point 515) and the rail handle 501 (which is a part of the first slider 505) is three times greater than that of the second slider 506 (attached to the second-slider connection point 516) and the swappable battery module 120 (supported on the second slider 506). As such, the force that needs to be applied to the rail handle 501 is three times less than the force needed to accelerate/decelerate the swappable battery module 120 and disengage/engage various fluidic and electric connections.

Figures 9D, 9E:
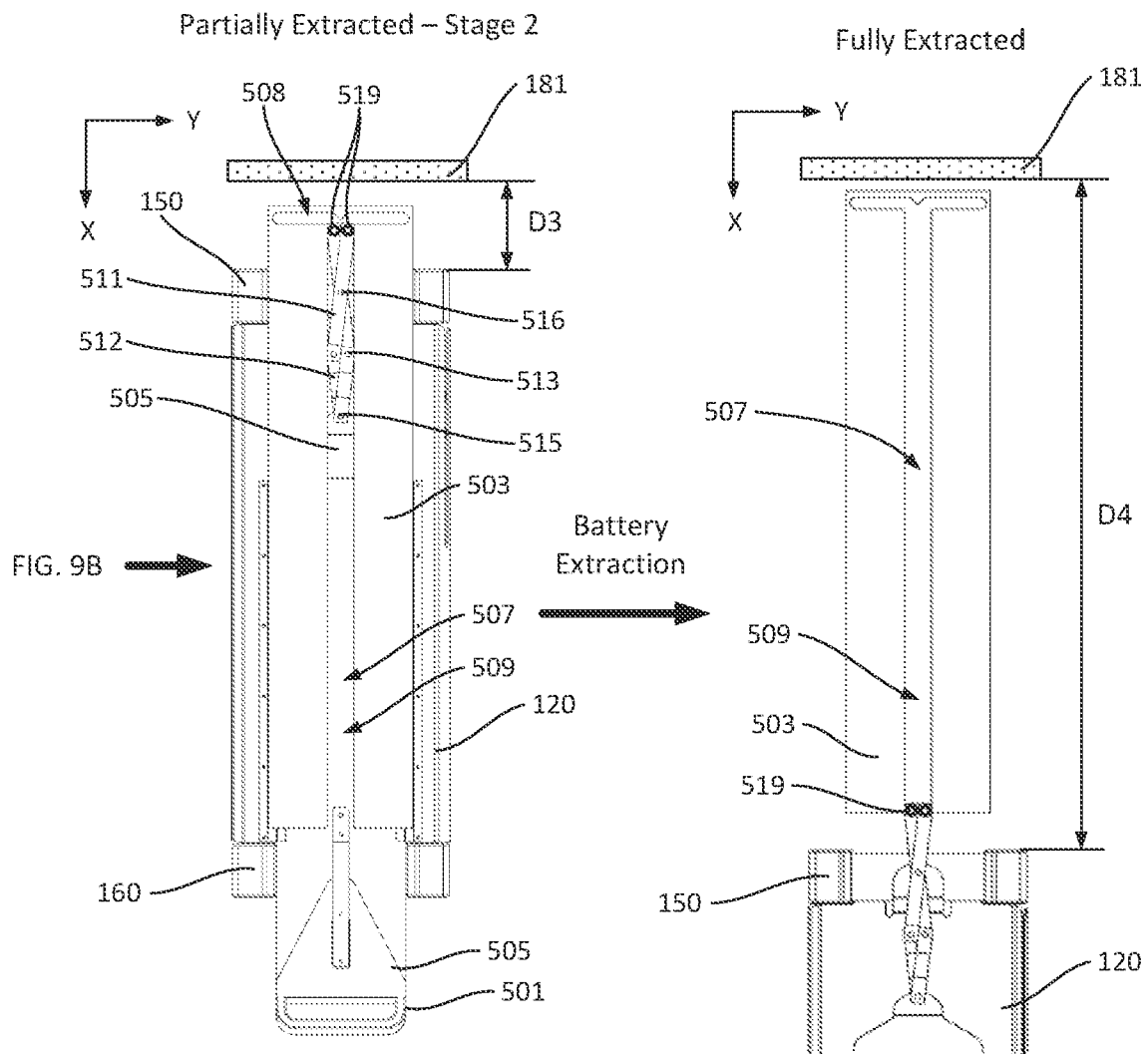

Referring to FIGS. 9D and 9E, once the bushings 519 reaches the extraction slot section 509 and starts moving within the extraction slot section 509 (along the X-axis), the first lever set 511 and second lever set 512 can no longer pivot, and all three points (i.e., the bushings 519, the second-slider connection point 516, and the first-slider connection point 515 moves with the same linear speed (along the extraction slot section 509/the X axis). As such, the speed of the first slider 505 (attached to the first-slider connection point 515) and the rail handle 501 (which is a part of the first slider 505) is the same as the speed of the second slider 506 (attached to the second-slider connection point 516) and the swappable battery module 120 (supported on the second slider 506). This speed equality ensures faster removal of the swappable battery module 120 from the corresponding slot in enclosure 186. At this point, various fluidic and electric connections are already fully disengaged, and no additional force is needed. FIG. 9E illustrates a position with the swappable battery module 120 fully extended from the rail base 503, which can be associated with a slot in enclosure 186. In some examples, the bushings 519 are configured to slide out of the extraction slot section 509 thereby separating the rail base 503 from the first slider 505 and from the second slider 506 for complete removal of the swappable battery module 120 from the external charger 180.

Method 400 may proceed with (block 460) removing the swappable battery module 120 from external charger 180.

This operation may be the reverse of the installation operation (block 440) described above. During the module removal operation, the electrical connection between swappable battery module 120 and external charger 180 is separated (e.g., by disconnecting first electrical terminal 241 and second electrical terminal 242 from the corresponding terminals on electric vehicle 100). In some examples (when swappable battery module 120 is fluidically connected to external charger 180), the battery removal operation (block 460) also comprises (block 462) disconnecting the fluidic coupling between swappable battery module 120 and external charger 180 in a manner similar to the one described above with reference to FIGS. 5A-5F.

CONCLUSION

Although the foregoing concepts have been described in some detail for purposes of clarity of understanding, it will be apparent that certain changes and modifications may be practiced within the scope of the appended claims. It should be noted that there are many alternative ways of implementing processes, systems, and apparatuses. Accordingly, the present examples are to be considered illustrative and not restrictive.

The invention claimed is:

1. A method of operating a swappable battery module, the method comprising:
positioning the swappable battery module on an external charger comprising charger fluidic ports positioned on a charger base, wherein:
the swappable battery module comprises prismatic battery cells, a tubular enclosure, attached to and enclosing the prismatic battery cells, a first end plate attached to the tubular enclosure, and a second end plate attached to the tubular enclosure,
the tubular enclosure forms a first fluid channel, a second fluid channel, a third fluid channel, and a fourth fluid channel with the prismatic battery cells,
the first end plate comprises a first fluidic port, fluidically coupled to both the first fluid channel and the third fluid channel, and a second fluidic port, fluidically coupled to both the second fluid channel and the fourth fluid channel, and
the second end plate fluidically interconnects the first fluid channel and the third fluid channel and, separately, fluidically interconnects the second fluid channel and the fourth fluid channel; and
sliding the swappable battery module such that the first end plate is directed toward the charger base and the charger fluidic ports until the charger fluidic ports are fluidically coupled with the first fluidic port and the second fluidic port, wherein:
the external charger comprises an enclosure and a module support rail slidably coupling the swappable battery module and the enclosure,
the module support rail comprises a rail base, a first slider, a second slider, and a lever-based unit, interconnecting the rail base, the first slider, and the second slider,
the rail base is fixed to the enclosure,
the second slider is detachably coupled to the swappable battery module, and
the first slider and the second slider move at different speeds or at a same speed relative to the charger base depending on proximity of the first end plate to the charger base.

2. The method of claim 1, wherein:
the rail base comprises a rail-base slot defined by an engagement slot section and an extraction slot section, extending perpendicular to the engagement slot section,
the lever-based unit comprises bushings slidably fit into the rail-base slot,
when the bushings are in the engagement slot section, the first slider moves faster than the second slider, and
when the bushings are in the extraction slot section, the first slider and the second slider move at the same speed.

3. The method of claim 2, wherein, when the bushings is in the engagement slot section, the first slider moves at least twice faster than the second slider.

4. The method of claim 2, wherein, when the bushings is in the engagement slot section, the first slider moves at least three times faster than the second slider.

5. The method of claim 2, wherein:
the lever-based unit comprises a first lever set and a second lever set, and
the first lever set is connected to the bushings at a first end, pivotably connected to the first slider at a midpoint, and pivotably connected to the second lever set at a second end of the first lever set, opposite to the first end, and
the second lever set is pivotably connected to the first lever set and the first slider at opposite ends of the second lever set.

6. The method of claim 5, wherein:
when the bushings slide within in the engagement slot section, an angle between the first lever set and the second lever set changes, and
when the bushings slide within the extraction slot section, the angle between the first lever set and the second lever set is constant.

7. The method of claim 2, wherein the engagement slot section comprises end points, operable as positive stops and define a closest position between the swappable battery module and the charger base.

8. The method of claim 2, wherein the bushings are configured to slide out of the extraction slot section thereby separating the rail base from the first slider and from the second slider for complete removal of the swappable battery module from the external charger.

9. The method of claim 1, wherein:
the first slider comprises a rail handle protruding past the second end plate of the swappable battery module, and
the rail handle and the swappable battery module move at different speeds or at a same speed relative to the charger base depending on proximity of the first end plate of the swappable battery module to the charger base.

10. The method of claim 1, wherein:
the charger base comprises two charger electric terminals,
the first end plate comprises a first electrical terminal and a second electrical terminal, and sliding the swappable battery module further comprises forming electrical connections between each of the first electrical terminal and the second electrical terminal and a corresponding one of the two charger electric terminals.

11. The method of claim 10, wherein (a) the first electrical terminal and the second electrical terminal are connected to the two charger electric terminals at a same time as (b) the charger fluidic ports are fluidically coupled with the first fluidic port and the second fluidic port.

12. The method of claim 1, further comprising charging the swappable battery module using the external charger while circulating thermal fluid through the swappable battery module using the external charger such that the thermal fluid flows through each of the first fluid channel, the second fluid channel, the third fluid channel, and the fourth fluid channel.

13. The method of claim 12, wherein:
the thermal fluid is flowed from the external charger into the swappable battery module through the first fluidic port of the swappable battery module,
the first end plate distributes the thermal fluid into a first portion, directed into the first fluid channel, and a second portion, directed into the third fluid channel,
the second end plate receives the first portion of the thermal fluid and redirects the first portion of the thermal fluid into the second fluid channel,
the second end plate also receives the second portion of the thermal fluid and redirects the second portion of the thermal fluid into the fourth fluid channel, and
the second end plate combines the first portion and the second portion of the thermal fluid and directs the thermal fluid from the swappable battery module and into the external charger through the second fluidic port of the swappable battery module.

14. The method of claim 1, further comprising removing the battery module from the external charger while decoupling the charger fluidic ports from the first fluidic port and the second fluidic port.

15. A method of operating a swappable battery module, the method comprising:
positioning the swappable battery module on an external charger comprising charger fluidic ports positioned on a charger base, wherein:
  the swappable battery module comprises prismatic battery cells, a tubular enclosure, attached to and enclosing the prismatic battery cells, a first end plate attached to the tubular enclosure, and a second end plate attached to the tubular enclosure,
  the tubular enclosure forms a first fluid channel, a second fluid channel, a third fluid channel, and a fourth fluid channel with the prismatic battery cells,
  the first end plate comprises a first fluidic port, fluidically coupled to both the first fluid channel and the third fluid channel, and a second fluidic port, fluidically coupled to both the second fluid channel and the fourth fluid channel, and
  the second end plate fluidically interconnects the first fluid channel and the third fluid channel and, separately, fluidically interconnects the second fluid channel and the fourth fluid channel; and
sliding the swappable battery module such that the first end plate is directed toward the charger base and the charger fluidic ports until the charger fluidic ports are fluidically coupled with the first fluidic port and the second fluidic port; and
removing the battery module from the external charger while decoupling the charger fluidic ports from the first fluidic port and the second fluidic port, wherein:
one of the charger fluidic ports and the first fluidic port is a first component while another one of the charger fluidic ports and the first fluidic port is a second component,
the first component comprises a first body, a first spool, a first seal, a slider, a first slider seal, and a first spring,
the first spool is slidably coupled to the first body and to the slider and biased, relative to the first body, by the first spring,
the first spool is sealed against the first body by the first seal,
the second component comprises a second body, a second seal, a second spool, and a second spring,
the second spool is slidably coupled to and biased, by the second spring, relative to the second body,
when the charger fluidic ports are fluidically coupled with the first fluidic port and the second fluidic port, the first spool extends into the second body and is sealed against the second body by the second seal, and
when the charger fluidic ports are fluidically decoupled from the first fluidic port and the second fluidic port, the first spool is sealed relative to the slider by the first slider seal while the second spool is sealed relative to the second body by the second seal.

16. The method of claim 15, wherein decoupling the charger fluidic ports from the first fluidic port and the second fluidic port comprises:
moving the first body away from the second body such that the first spool is biased by the first spring out of the first body and such that the slider follows the first body and is retracted into the first spool,
further moving the first body away from the second body such that the slider follows the first body and is retracted into the first spool and such that the first slider seal is sealed against the first spool thereby preventing a thermal fluid from flowing between a cavity inside the slider and a space between the slider and the second body,
further moving the first body away from the second body such that the first slider seal remains sealed against the first spool thereby preventing flow of the thermal fluid and such that the first spool is no longer being pushed out of the first body and such that the first spool is now extracted from the second body, and
further moving the first body away from the second body such that the first slider seal remains sealed against the first spool thereby preventing the flow of the thermal fluid, such that the first spool continues being extracted from the second body, and such that the second seal disengages the first spool and engages the second spool.

17. The method of claim 1, wherein:
the prismatic battery cells comprise cell terminals,
the swappable battery module further comprises bus bars forming at least a first bus-bar row and a second bus-bar row and interconnecting the cell terminals,
the first bus-bar row extends within the first fluid channel,
the second bus-bar row extends within the second fluid channel, and
the cell terminals, the first bus-bar row, and the second bus-bar row are submerged and immersively cooled by a thermal fluid, which flows through and between the first fluidic port and the second fluidic port.

18. The method of claim 17, wherein:
the bus bars form at least a third bus-bar row extending within the second fluid channel,
one of the bus bars in the first bus-bar row is electrically coupled to a first electrical terminal of an end cell of the prismatic battery cells, and
one of the bus bars in the third bus-bar row is electrically coupled to a second electrical terminal of the end cell of the prismatic battery cells.

19. The method of claim 1, wherein:
a thermal fluid flows through and between the first fluidic port and the second fluidic port, and
the thermal fluid is a transformer oil.

20. The method of claim 16, wherein the thermal fluid is a transformer oil.

\* \* \* \* \*